United States Patent
Huang

(10) Patent No.: US 11,721,634 B2
(45) Date of Patent: Aug. 8, 2023

(54) CONDUCTIVE STRUCTURE AND WIRING STRUCTURE INCLUDING THE SAME

(71) Applicant: Advanced Semiconductor Engineering, Inc., Kaohsiung (TW)

(72) Inventor: Wen Hung Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 83 days.

(21) Appl. No.: 17/157,795

(22) Filed: Jan. 25, 2021

(65) Prior Publication Data

US 2021/0151381 A1    May 20, 2021

Related U.S. Application Data

(63) Continuation of application No. 16/399,907, filed on Apr. 30, 2019, now Pat. No. 10,903,169.

(51) Int. Cl.
| | |
|---|---|
| *H01L 23/31* | (2006.01) |
| *H01L 23/49* | (2006.01) |
| *H01L 23/13* | (2006.01) |
| *H01L 23/52* | (2006.01) |
| *H01L 23/538* | (2006.01) |
| *H01L 21/48* | (2006.01) |
| *H01L 21/52* | (2006.01) |
| *H01L 21/56* | (2006.01) |

(52) U.S. Cl.
CPC ........ *H01L 23/5389* (2013.01); *H01L 21/486* (2013.01); *H01L 21/4857* (2013.01); *H01L 21/52* (2013.01); *H01L 21/56* (2013.01); *H01L 23/3121* (2013.01); *H01L 23/5383* (2013.01); *H01L 23/5384* (2013.01); *H01L 23/5386* (2013.01)

(58) Field of Classification Search
CPC ............ H01L 23/5389; H01L 23/3121; H01L 23/5383; H01L 23/5384; H01L 23/5386; H01L 23/49827; H01L 23/49822; H01L 23/13; H01L 23/49832; H01L 23/528316; H01L 23/28; H01L 23/3185; H01L 2224/18; H01L 2224/023; H01L 24/23
See application file for complete search history.

(56) References Cited

U.S. PATENT DOCUMENTS

| | | | |
|---|---|---|---|
| 7,321,164 B2 | 1/2008 | Hsu | |
| 7,342,803 B2 * | 3/2008 | Inagaki | H01L 23/50 |
| | | | 257/E23.079 |
| 7,656,015 B2 * | 2/2010 | Wong | H01L 24/82 |
| | | | 257/723 |
| 8,288,875 B2 | 10/2012 | Shimizu et al. | |

(Continued)

OTHER PUBLICATIONS

Non-Final Office Action for U.S. Appl. No. 16/399,907, dated May 5, 2020, 11 pages.

(Continued)

*Primary Examiner* — Ida M Soward
(74) *Attorney, Agent, or Firm* — Foley & Lardner LLP

(57) ABSTRACT

A conductive structure includes a core portion, a plurality of electronic devices and a filling material. The core portion defines a cavity. The electronic devices are disposed in the cavity of the core portion. The filling material is disposed between the electronic devices and a sidewall of the cavity of the core portion.

4 Claims, 35 Drawing Sheets

(56) References Cited

U.S. PATENT DOCUMENTS

| | | |
|---|---|---|
| 8,941,230 B2 | 1/2015 | Kyozuka et al. |
| 9,119,319 B2 | 8/2015 | Kaneda et al. |
| 9,232,657 B2 | 1/2016 | Kiwanami et al. |
| 10,026,681 B2 | 7/2018 | Ko et al. |
| 10,050,016 B2 | 8/2018 | Lee et al. |
| 10,256,200 B2 | 4/2019 | Park et al. |
| 10,269,722 B2 * | 4/2019 | Lin .................. H01L 24/81 |
| 10,347,598 B2 | 7/2019 | Baek et al. |
| 10,485,098 B2 | 11/2019 | Miki |
| 10,510,698 B2 | 12/2019 | Yu et al. |
| 10,573,613 B2 * | 2/2020 | Kim ................ H01L 23/3128 |
| 10,681,820 B2 | 6/2020 | Sawatari et al. |
| 2007/0278644 A1 * | 12/2007 | Hsu .................... H01L 24/24 |
| | | 257/E23.085 |
| 2008/0136002 A1 * | 6/2008 | Yang .................. H01L 24/82 |
| | | 257/686 |
| 2008/0296056 A1 * | 12/2008 | Kinoshita ............ H05K 1/183 |
| | | 29/846 |
| 2009/0085192 A1 * | 4/2009 | Hsu .................... H05K 1/185 |
| | | 438/118 |
| 2009/0309202 A1 * | 12/2009 | Hsu ................. H01L 31/0203 |
| | | 257/680 |
| 2010/0002406 A1 | 1/2010 | Hsu |
| 2010/0032827 A1 * | 2/2010 | Hsu .................... H01L 24/25 |
| | | 257/692 |
| 2011/0031606 A1 * | 2/2011 | Chen .................. H05K 1/185 |
| | | 257/690 |
| 2013/0319740 A1 * | 12/2013 | Sato .................. H05K 3/4602 |
| | | 174/258 |
| 2014/0175663 A1 * | 6/2014 | Chen ............... H01L 23/49816 |
| | | 257/774 |
| 2014/0185264 A1 | 7/2014 | Chen et al. |
| 2014/0210109 A1 * | 7/2014 | Tanaka ............. H01L 23/5389 |
| | | 438/126 |
| 2014/0291859 A1 * | 10/2014 | Kiwanami ........ H01L 23/49822 |
| | | 257/774 |
| 2014/0360765 A1 * | 12/2014 | Kiwanami ............ H05K 1/185 |
| | | 174/260 |
| 2015/0279776 A1 | 10/2015 | Hu et al. |
| 2016/0013076 A1 | 1/2016 | Vincent et al. |
| 2016/0066417 A1 * | 3/2016 | Sugiyama ............ H05K 3/4641 |
| | | 361/760 |
| 2016/0081194 A1 * | 3/2016 | Sato .................... H05K 1/185 |
| | | 361/761 |
| 2016/0338202 A1 | 11/2016 | Park et al. |
| 2016/0351545 A1 * | 12/2016 | Hong ............... H01L 23/49827 |
| 2017/0141744 A1 * | 5/2017 | Kim ................ H01L 23/49827 |
| 2018/0096968 A1 * | 4/2018 | Lee .................... H01L 25/0652 |
| 2018/0337136 A1 * | 11/2018 | Han .................... H01L 23/5385 |
| 2018/0350747 A1 | 12/2018 | Hwang et al. |
| 2018/0350786 A1 | 12/2018 | Hung et al. |
| 2019/0131224 A1 | 5/2019 | Choi et al. |
| 2019/0139853 A1 | 5/2019 | Oh et al. |
| 2020/0020653 A1 | 1/2020 | Lim et al. |
| 2020/0051918 A1 * | 2/2020 | Bae .................. H01L 23/5389 |
| 2020/0105663 A1 * | 4/2020 | Tsai ................ H01L 23/49827 |
| 2020/0219783 A1 | 7/2020 | Kim et al. |
| 2021/0151370 A1 * | 5/2021 | Choi .................... H01L 24/18 |

OTHER PUBLICATIONS

Non-Final Office Action for U.S. Appl. No. 16/399,909, dated May 5, 2020, 10 pages.

Notice of Allowance for U.S. Appl. No. 16/399,909, dated Sep. 24, 2020, 11 pages.

Non-Final Office Action for U.S. Appl. No. 16/399,909, dated May 5, 2020, 11 pages.

* cited by examiner

CONDUCTIVE STRUCTURE AND WIRING STRUCTURE INCLUDING THE SAME

CROSS-REFERENCE TO RELATED APPLICATION

This application is a continuation of U.S. patent application Ser. No. 16/399,907 filed Apr. 30, 2019, the contents of which is incorporated herein by reference in its entirety.

BACKGROUND

1. Field of the Disclosure

The present disclosure relates to a conductive structure and wiring structure including the same, and to a conductive structure including a plurality of electronic devices disposed in a cavity thereof, and a wiring structure including the conductive structure.

2. Description of the Related Art

Along with the rapid development in electronics industry and the progress of semiconductor processing technologies, semiconductor chips are integrated with an increasing number of electronic components to achieve improved electrical performance and additional functions. Accordingly, the semiconductor chips are provided with more input/output (I/O) connections. To manufacture semiconductor packages including semiconductor chips with an increased number of I/O connections, circuit layers of semiconductor substrates used for carrying the semiconductor chips may correspondingly increase in size. Thus, a thickness and a warpage of a semiconductor substrate may correspondingly increase, and a yield of the semiconductor substrate may decrease.

SUMMARY

In some embodiments, a conductive structure includes a core portion, a plurality of electronic devices and a filling material. The core portion defines a cavity. The electronic devices are disposed in the cavity of the core portion. The filling material is disposed between the electronic devices and a sidewall of the cavity of the core portion.

In some embodiments, a conductive structure includes a core portion, a module and a filling material. The core portion defines a cavity. The module is disposed in the cavity of the core portion. The module includes a plurality of known good electronic devices and an encapsulant encapsulating the known good electronic devices. The filling material is disposed between a lateral surface of the module and a sidewall of the cavity of the core portion.

In some embodiments, a wiring structure includes an upper conductive structure, a lower conductive structure and an intermediate layer. The upper conductive structure includes at least one dielectric layer and at least one circuit layer in contact with the dielectric layer. The lower conductive structure includes a core portion, a plurality of electronic devices and a filling material. The core portion defines a cavity. The electronic devices are disposed in the cavity of the core portion. The filling material is disposed between the electronic devices and a sidewall of the cavity of the core portion. The intermediate layer is disposed between the upper conductive structure and the lower conductive structure and bonds the upper conductive structure and the lower conductive structure together. The upper conductive structure is electrically connected to the lower conductive structure.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
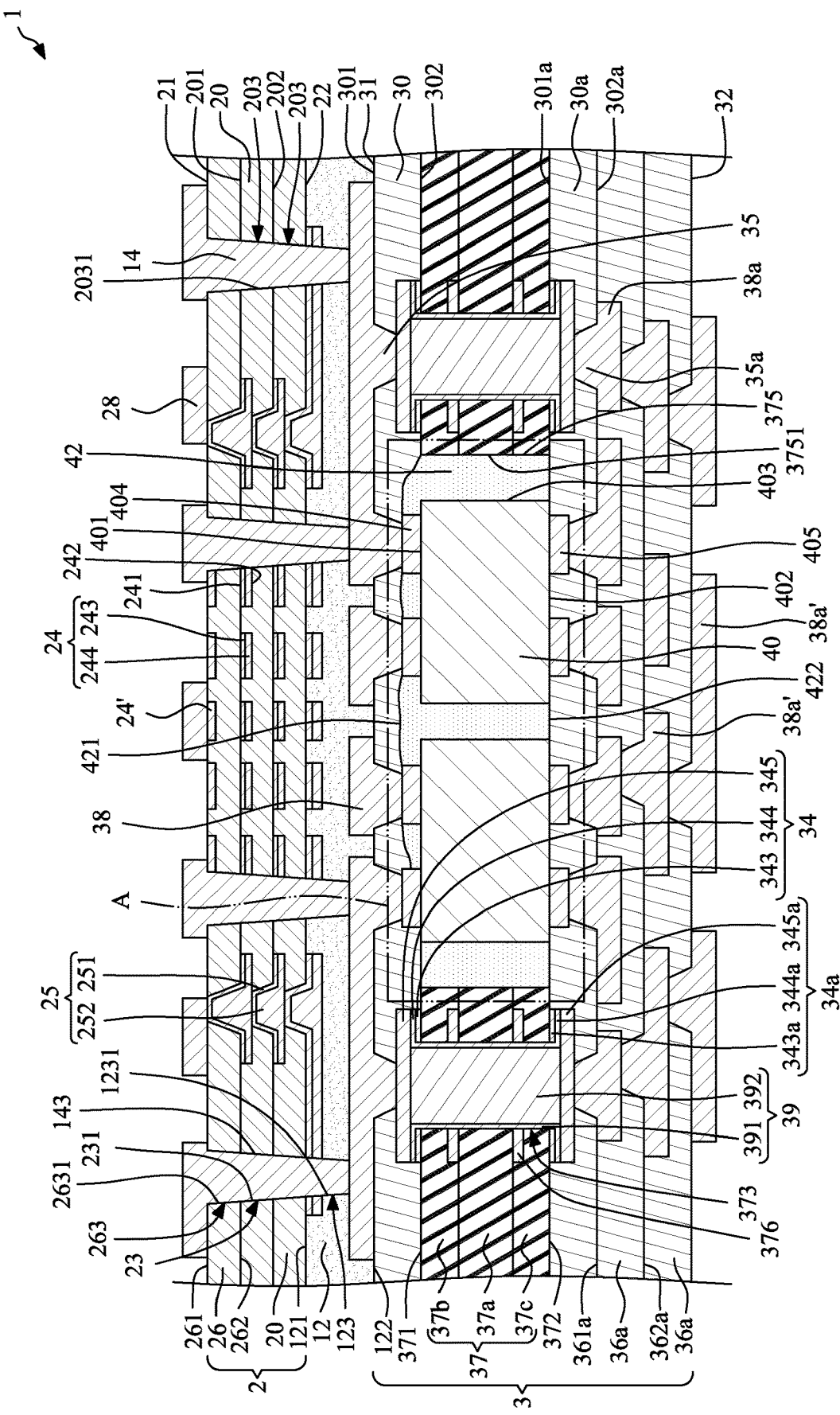
FIG. 1 illustrates a cross-sectional view of a wiring structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

To meet the specification of increasing I/O counts, a number of dielectric layers of a substrate should increase. In some comparative embodiments, a manufacturing process of a core substrate may include the following stages. Firstly, a core with two copper foils disposed on two sides thereof is provided. Then, a plurality of dielectric layers and a plurality of circuit layers are formed or stacked on the two copper foils. One circuit layer may be embedded in one corresponding dielectric layer. Therefore, the core substrate may include a plurality of stacked dielectric layers and a plurality of circuit layers embedded in the dielectric layers on both sides of the core. Since a line width/line space (L/S) of the circuit layers of such core substrate may be greater than or equal to 10 micrometers (μm)/10 μm, the number of the dielectric layers of such core substrate is relatively large. Although the manufacturing cost of such core substrate is low, the manufacturing yield for the circuit layers and the dielectric layers of such core substrate is also low, and, thus, the yield of such core substrate is low. In addition, each dielectric layer is relatively thick, and, thus, such core substrate is relatively thick. In some comparative embodiments, if a package has 10000 I/O counts, such core substrate may include twelve layers of circuit layers and dielectric layers. The manufacturing yield for one layer (including one circuit layer and one dielectric layer) of such core substrate may be 90%. Thus, the yield of such core substrate may be $(0.9)^{12}$=28.24%. In addition, warpage of the twelve layers of circuit layers and dielectric layers may be accumulated, and, thus, the top several layers may have severe warpage. As a result, the yield of such core substrate may be further reduced.

To address the above concerns, in some comparative embodiments, a coreless substrate is provided. The coreless substrate may include a plurality of dielectric layers and a plurality of fan-out circuit layers. In some embodiments, a manufacturing process of a coreless substrate may include the following stages. Firstly, a carrier is provided. Then, a plurality of dielectric layers and a plurality of fan-out circuit layers are formed or stacked on a surface of the carrier. One fan-out circuit layer may be embedded in one corresponding dielectric layer. Then, the carrier is removed. Therefore, the coreless substrate may include a plurality of stacked dielectric layers and a plurality of fan-out circuit layers embedded in the dielectric layers. Since a line width/line space (L/S) of the fan-out circuit layers of such coreless substrate may be less than or equal to 2 μm/2 μm, the number of the dielectric layers of such coreless substrate can be reduced. Further, the manufacturing yield for the fan-out circuit layers and the dielectric layers of such coreless substrate is high. For example, the manufacturing yield for one layer (including one fan-out circuit layer and one dielectric layer) of such coreless substrate may be 99%. However, the manufacturing cost of such coreless substrate is relatively high.

At least some embodiments of the present disclosure provide for a conductive structure including a plurality of electronic devices reconstituted in a cavity of a core portion of the conductive structure, so as to reduce a thickness of the conductive structure, and reduce power loss. Further, at least some embodiments of the present disclosure provide for a wiring structure which has an advantageous compromise of yield and manufacturing cost. In some embodiments, the wiring structure includes an upper conductive structure and a lower conductive structure bonded to the upper conductive structure through an intermediate layer. At least some embodiments of the present disclosure further provide for techniques for manufacturing the conductive structure and the wiring structure.

FIG. 1 illustrates a cross-sectional view of a wiring structure 1 according to some embodiments of the present disclosure. The wiring structure 1 includes an upper conductive structure 2, a lower conductive structure 3, an intermediate layer 12 and at least one upper through via 14.

The upper conductive structure 2 includes at least one dielectric layer (including, for example, two first dielectric layers 20 and a second dielectric layer 26) and at least one circuit layer (including, for example, a topmost circuit layer 24', three first circuit layers 24 and a second circuit layer 28 formed of a metal, a metal alloy, or other conductive material) in contact with the dielectric layer (e.g., the first dielectric layers 20 and the second dielectric layer 26). In some embodiments, the upper conductive structure 2 may be similar to a coreless substrate, and may be in a wafer type, a panel type or a strip type. The upper conductive structure 2 may be also referred to as "a stacked structure" or "a high-density conductive structure" or "a high-density stacked structure". The circuit layer (including, for example, the topmost circuit layer 24' and the three circuit layers 24) of the upper conductive structure 2 may be also referred to as "a high-density circuit layer". In some embodiments, a density of a circuit line (including, for example, a trace or a pad) of the high-density circuit layer is greater than a density of a circuit line of a low-density circuit layer. That is, the count of the circuit line (including, for example, a trace or a pad) in a unit area of the high-density circuit layer is greater than the count of the circuit line in an equal unit area of the low-density circuit layer, such as about 1.2 times or greater, about 1.5 times or greater, or about 2 times or greater. Alternatively, or in combination, a line width/line space (L/S) of the high-density circuit layer is less than a L/S of the low-density circuit layer, such as about 90% or less, about 50% or less, or about 20% or less. Further, the conductive structure that includes the high-density circuit layer may be designated as the "high-density conductive structure", and the conductive structure that includes the low-density circuit layer may be designated as a "low-density conductive structure".

The upper conductive structure 2 has a top surface 21 and a bottom surface 22 opposite to the top surface 21, and defines at least one through hole 23, each of which is a single, continuous through hole. The upper conductive structure 2 includes a plurality of dielectric layers (e.g., the two first dielectric layers 20 and the second dielectric layer 26), a plurality of circuit layers (e.g., the topmost circuit layer 24', the three first circuit layers 24 and the second circuit layer 28) and at least one inner via 25. The dielectric layers (e.g., the first dielectric layers 20 and the second dielectric layer 26) are stacked on one another. For example, the second dielectric layer 26 is disposed on the first dielectric layers 20, and, thus, the second dielectric layer 26 is the topmost dielectric layer. In some embodiments, a material of the dielectric layers (e.g., the first dielectric layers 20 and the second dielectric layer 26) is transparent, and can be seen through by human eyes or machine. That is, a mark disposed adjacent to the bottom surface 22 of the upper conductive structure 2 can be recognized or detected from the top surface 21 of the upper conductive structure 2 by human eyes or machine. In some embodiments, a transparent material of the dielectric layers has a light transmission for a wavelength in the visible range (or other pertinent wavelength for detection of a mark) of at least about 60%, at least about 70%, or at least about 80%.

In addition, each of the first dielectric layers 20 has a top surface 201 and a bottom surface 202 opposite to the top surface 201, and defines a through hole 203 having an inner surface 2031. The second dielectric layer 26 has a top surface 261 and a bottom surface 262 opposite to the top surface 261, and defines a through hole 263 having an inner surface 2631. The bottom surface 262 of the second dielectric layer 26 is disposed on and contacts the top surface 201 of the adjacent first dielectric layer 20. Thus, the top surface 21 of the upper conductive structure 2 is the top surface 261 of the second dielectric layer 26, and the bottom surface 22 of the upper conductive structure 2 is the bottom surface 202 of the bottommost first dielectric layer 20.

As shown in FIG. 1, each of the through holes 203 of the first dielectric layers 20 tapers downwardly along a direction from the top surface 21 towards the bottom surface 22 of the upper conductive structure 2; that is, a size of a top portion of the through hole 203 is greater than a size of a bottom portion of the through hole 203. The through hole 263 of the second dielectric layer 26 also tapers downwardly; that is, a size of a top portion of the through hole 263 is greater than a size of a bottom portion of the through hole 263. Further, the through hole 263 of the second dielectric layer 26 is aligned with and in communication with the through holes 203 of the first dielectric layers 20. The bottom portion of the through hole 263 of the second dielectric layer 26 is disposed adjacent to or connected to the top portion of the through hole 203 of the first dielectric layer 20 under the second dielectric layer 26. The size of the bottom portion of the through hole 263 of the second dielectric layer 26 is substantially equal to the size of the top portion of the through hole 203 of the first dielectric layer 20 under the second dielectric layer 26. Thus, the inner surface 2631 of the through hole 263 of the second dielectric layer 26 is coplanar with or aligned with the inner surfaces 2031 of the through holes 203 of the first dielectric layers 20. It is noted that the above-mentioned "coplanar" surfaces need not be flat. In some embodiments, the inner surface 2631 of the through hole 263 of the second dielectric layer 26 and the inner surfaces 2031 of the through holes 203 of the first dielectric layers 20 may be curved surfaces, and are portions of an inner surface 231 of the single, continuous through hole 23 for accommodating the upper through via 14. The through hole 263 of the second dielectric layer 26 and the through holes 203 of the first dielectric layers 20 are collectively configured to form or define a portion of the single through hole 23. As shown in FIG. 1, cross-sectional views of one side of the inner surface 2631 of the through hole 263 of the second dielectric layer 26 and the inner surfaces 2031 of the through holes 203 of the first dielectric layers 20 are segments of a substantially straight line. That is, cross-sectional views of one side of the inner surface 2631 of the through hole 263 of the second dielectric layer 26 and the inner surfaces 2031 of the through holes 203 of the first dielectric layers 20 may extend along the same substantially straight line. The single through hole 23 extends through the upper conductive structure 2; that is, the single through hole 23 extends from the top surface 21 of the upper conductive structure 2 to the bottom surface 22 of the upper conductive structure 2. The single through hole 23 tapers downwardly.

The first circuit layers 24 may be fan-out circuit layers or redistribution layers (RDLs), and an L/S of the first circuit layers 24 may be less than or equal to about 2 µm/about 2 µm, or less than or equal to about 1.8 µm/about 1.8 µm. Each of the first circuit layers 24 has a top surface 241 and a bottom surface 242 opposite to the top surface 241. In some embodiments, the first circuit layer 24 is embedded in the corresponding first dielectric layer 20, and the top surface 241 of the first circuit layer 24 may be substantially coplanar with the top surface 201 of the first dielectric layer 20. In some embodiments, each first circuit layer 24 may include a seed layer 243 and a conductive metallic material 244 disposed on the seed layer 243. As shown in FIG. 1, the bottommost first circuit layer 24 is disposed on and protrudes from the bottom surface 22 of the upper conductive structure 2 (e.g., the bottom surface 202 of the bottommost first dielectric layer 20). Further, the topmost circuit layer 24' may omit a seed layer, and may be electrically connected to the below circuit layer 24 through the inner vias 25. A top surface of the topmost circuit layer 24' may be substantially coplanar with the top surface 21 of the upper conductive structure 2 (e.g., the top surface 261 of the second dielectric layer 26). Thus, the top surface of the topmost circuit layer 24' may be exposed from the top surface 21 of the upper conductive structure 2 (e.g., the top surface 261 of the second dielectric layer 26). However, in some embodiments, the topmost circuit layer 24' may be omitted; thus, a horizontally connecting or extending circuit layer may be omitted in the second dielectric layer 26. In addition, the second circuit layer 28 is disposed on and protrudes from the top surface 21 of the upper conductive structure 2 (e.g., the top surface 261 of the second dielectric layer 26). An L/S of the second circuit layer 28 may be greater than or equal to the L/S of the first circuit layer 24.

The upper conductive structure 2 includes a plurality of inner vias 25. Some of the inner vias 25 are disposed between two adjacent first circuit layers 24 for electrically connecting the two first circuit layers 24. Some of the inner vias 25 are disposed between the first circuit layer 24 and the top circuit layer 24' for electrically connecting the first circuit layer 24 and the top circuit layer 24'. Some of the inner vias 25 are disposed between the first circuit layer 24 and the second circuit layer 28 for electrically connecting the first circuit layer 24 and the second circuit layer 28. In some embodiments, each inner via 25 may include a seed layer 251 and a conductive metallic material 252 disposed on the seed layer 251. In some embodiments, each inner via 25 and the corresponding first circuit layer 24 may be formed integrally as a monolithic or one-piece structure. Each inner via 25 tapers upwardly along a direction from the bottom surface 22 towards the top surface 21 of the upper conductive structure 2. That is, a size (e.g., a width) of a top portion of the inner via 25 is less than a size (e.g., a width) of a bottom portion of the inner via 25 that is closer towards the bottom surface 22. In some embodiments, a maximum width of the inner via 25 (e.g., at the bottom portion) may be less than or equal to about 25 µm, such as about 25 µm, about 20 µm about 15 µm or about 10 µm.

The lower conductive structure 3 includes at least one dielectric layer (including, for example, one first upper dielectric layer 30, one first lower dielectric layer 30a and two second lower dielectric layers 36a) and at least one circuit layer (including, for example, one first upper circuit layer 34, one second upper circuit layers 38, one first lower circuit layer 34a and three second lower circuit layers 38a, 38a' formed of a metal, a metal alloy, or other conductive material) in contact with the dielectric layer (e.g., the first upper dielectric layer 30, the first lower dielectric layer 30a and the second lower dielectric layer 36a), and a plurality of electronic devices 40. In some embodiments, the lower conductive structure 3 may be similar to a core substrate that further includes a core portion 37, and may be in a wafer type, a panel type or a strip type. The lower conductive structure 3 may be also referred to as "a stacked structure" or "a low-density conductive structure" or "a low-density stacked structure". The circuit layer (including, for example, the first upper circuit layer 34, the second upper circuit layers 38, the first lower circuit layer 34a and the three second lower circuit layers 38a, 38a') of the lower conductive structure 3 may be also referred to as "a low-density circuit layer". As shown in FIG. 1, the lower conductive structure 3 has a top surface 31 and a bottom surface 32 opposite to the top surface 31. The lower conductive structure 3 includes a plurality of dielectric layers (for example, the first upper dielectric layer 30, the first lower dielectric layer 30a and the second lower dielectric layer 36a), a plurality of circuit layers (for example, the first upper circuit layer 34, the second upper circuit layer 38, the first lower circuit layer 34a and the three second lower circuit layers 38a, 38a') and at least one inner via (including, for example, a plurality of upper interconnection vias 35 and a plurality of lower interconnection vias 35a).

The core portion 37 has a top surface 371 and a bottom surface 372 opposite to the top surface 371, and defines a plurality of through holes 373 and a cavity 375 extending through the core portion 37. The core portion 37 may include a first core material layer 37a, a second core material layer 37b, a third core material layer 37c and two inner circuit layers 376. The first core material layer 37a, the second core material layer 37b and the third core material layer 37c are stacked on one another, and the inner circuit layers 376 are disposed between the first core material layer 37a and the second core material layer 37b, and between the first core material layer 37a and the third core material layer 37c. The cavity 375 may extend through the first core material layer 37a, the second core material layer 37b and the third core material layer 37c.

An interconnection via 39 is disposed or formed in each through hole 373 for vertical connection. The interconnection vias 39 may surround the cavity 375 and extend through the core portion 37. In some embodiments, each interconnection via 39 includes a base metallic layer 391 and an insulation material 392. The base metallic layer 391 is disposed or formed on a side wall of the through hole 373, and defines a central through hole. The insulation material 392 fills the central through hole defined by the base metallic layer 391. In some embodiments, the interconnection via 39 may omit an insulation material, and may include a bulk metallic material that fills the through hole 373.

The electronic devices 40 are disposed in the cavity 375 of the core portion 37. In some embodiments, the electronic devices 40 may be passive components, such as capacitors. The sizes and functions of the electronic devices 40 may be same as or different from each other. Each of the electronic devices 40 has a top surface 401, a bottom surface 402 opposite to the top surface 401 and a lateral surface 403 extending between the top surface 401 and the bottom surface 402. Each of the electronic devices 40 includes at least one electrical contact (e.g., a plurality of top electrical contacts 404 disposed adjacent to the top surface 401, and a plurality of bottom electrical contacts 405 disposed adjacent to the bottom surface 402). For example, each of the top electrical contacts 404 and the bottom electrical contacts 405 may be an electrode. In some embodiments, the electronic devices 40 may be disposed side by side, and the number of the electronic devices 40 may be greater than ten, greater than twenty, greater than forty, or greater than sixty. In some embodiments, the electronic devices 40 are known good electronic devices 40 that are reconstituted or rearranged in the cavity 375 of the core portion 37. As shown in FIG. 1, the bottom surfaces 402 of the electronic devices 40 may be substantially coplanar with the bottom surface 372 of the core portion 37, and the top surfaces 401 of the electronic devices 40 may be substantially coplanar with the top surface 371 of the core portion 37.

The filling material 42 is disposed between the electronic devices 40 and a sidewall 3751 of the cavity 375 of the core portion 37. As shown in FIG. 1, the filling material 42 is disposed between the lateral surfaces 403 of adjacent two electronic devices 40, and between the lateral surface 403 the electronic device 40 and the sidewall 3751 of the cavity 375 of the core portion 37. The filling material 42 has a top surface 421 and a bottom surface 422 opposite to the top surface 421. A portion of the filling material 42 may extend to the top surfaces 401 of the electronic devices 40. That is, the top surface 421 of the filling material 42 may be higher than the top surfaces 401 of the electronic devices 40. However, the filling material 42 does not completely cover the electrical contact (e.g., the top electrical contacts 404 and the bottom electrical contacts 405). Thus, the electrical contact (e.g., the top electrical contacts 404 and the bottom electrical contacts 405) may be exposed from the filling material 42. As shown in FIG. 1, the bottom surface 422 of the filling material 42 may be substantially coplanar with the bottom surfaces 402 of the electronic devices 40. In some embodiments, a material of the filling material 42 may be resin, ink (e.g. Ajinomoto build-up film (ABF) ink), or molding compound. The filling material 42 may have no fillers. Alternatively, the filling material 42 may have fillers with a size of 1~2 μm or less. In addition, a film loss of the filling material 42 may be less than 0.4% so as to resist the chemical etching.

The first upper dielectric layer 30 is disposed on the top surface 371 of the core portion 37, and has a top surface 301 and a bottom surface 302 opposite to the top surface 301. Thus, the bottom surface 302 of the first upper dielectric layer 30 contacts the top surface 371 of the core portion 37. In addition, the first lower dielectric layer 30a is disposed on the bottom surface 372 of the core portion 37, and has a top surface 301a and a bottom surface 302a opposite to the top surface 301a. Thus, the top surface 301a of the first lower dielectric layer 30a contacts the bottom surface 372 of the core portion 37. The two second lower dielectric layers 36a are stacked or disposed on the first lower dielectric layer 30a, and each has a top surface 361a and a bottom surface 362a opposite to the top surface 361a. Thus, the top surface 361a of the top second lower dielectric layer 36a contacts the bottom surface 302a of the first lower dielectric layer 30a, and the bottom second lower dielectric layer 36a is the bottommost dielectric layer. As shown in FIG. 1, the top surface 31 of the lower conductive structure 3 is the top surface 301 of the first upper dielectric layer 30, and the bottom surface 32 of the lower conductive structure 3 is the bottom surface of the bottom second lower dielectric layer 36a.

A thickness of each of the dielectric layers (e.g., the first dielectric layers 20 and the second dielectric layer 26) of the upper conductive structure 2 is less than or equal to about 40%, less than or equal to about 35%, less than or equal to about 30% of a thickness of each of the dielectric layers (e.g., the first upper dielectric layer 30, the first lower dielectric layer 30a and the two second lower dielectric layers 36a) of the lower conductive structure 3. For example, a thickness of each of the dielectric layers (e.g., the first dielectric layers 20 and the second dielectric layer 26) of the upper conductive structure 2 may be less than or equal to about 7 µm, and a thickness of each of the dielectric layers (e.g., the first upper dielectric layer 30, the first lower dielectric layer 30a and the two second lower dielectric layers 36a) of the lower conductive structure 3 may be about 40 µm.

An L/S of the first upper circuit layer 34 may be greater than or equal to about 10 µm/about 10 µm. Thus, the L/S of the first upper circuit layer 34 may be greater than or equal to about five times the L/S of the first circuit layers 24 of the upper conductive structure 2. The first upper circuit layer 34 has a top surface and a bottom surface opposite to the top surface. In some embodiments, the first upper circuit layer 34 is formed or disposed on the top surface 371 of the core portion 37, and covered by the first upper dielectric layer 30. The bottom surface of the first upper circuit layer 34 contacts the top surface 371 of the core portion 37. In some embodiments, the first upper circuit layer 34 may include a first metallic layer 343, a second metallic layer 344 and a third metallic layer 345. The first metallic layer 343 is disposed on the top surface 371 of the core portion 37, and may be formed from a copper foil (e.g., may constitute a portion of the copper foil). The second metallic layer 344 is disposed on the first metallic layer 343, and may be a plated copper layer. The third metallic layer 345 is disposed on the second metallic layer 344, and may be another plated copper layer. In some embodiments, the third metallic layer 345 may be omitted.

An L/S of the second upper circuit layer 38 may be greater than or equal to about 10 µm/about 10 µm. Thus, the L/S of the second upper circuit layer 38 may be substantially equal to the L/S of the first upper circuit layer 34, and may be greater than or equal to about five times the L/S of the first circuit layers 24 of the upper conductive structure 2. The second upper circuit layer 38 has a top surface and a bottom surface opposite to the top surface. In some embodiments, the second upper circuit layer 38 is disposed on and protrudes from the top surface 301 of the first upper dielectric layer 30. The bottom surface of the second upper circuit layer 38 contacts the top surface 301 of the first upper dielectric layer 30. In some embodiments, the second upper circuit layer 38 is electrically connected to the first upper circuit layer 34 through the upper interconnection vias 35. That is, the upper interconnection vias 35 are disposed between the second upper circuit layer 38 and the first upper circuit layer 34 for electrically connecting the second upper circuit layer 38 and the first upper circuit layer 34. Further, the second upper circuit layer 38 is electrically connected to the top electrical contacts 404 of the electronic devices 40 through the upper interconnection vias 35. In some embodiments, the second upper circuit layer 38 and the upper interconnection vias 35 are formed integrally as a monolithic or one-piece structure. Each upper interconnection via 35 tapers downwardly along a direction from the top surface 31 towards the bottom surface 32 of the lower conductive structure 3.

An L/S of the first lower circuit layer 34a may be greater than or equal to about 10 µm/about 10 µm. Thus, the L/S of the first lower circuit layer 34a may be greater than or equal to about five times the L/S of the first circuit layers 24 of the upper conductive structure 2. The first lower circuit layer 34a has a top surface and a bottom surface opposite to the top surface. In some embodiments, the first lower circuit layer 34a is formed or disposed on the bottom surface 372 of the core portion 37, and covered by the first lower dielectric layer 30a. The top surface of the first lower circuit layer 34a contacts the bottom surface 372 of the core portion 37. In some embodiments, the first lower circuit layer 34a may include a first metallic layer 343a, a second metallic layer 344a and a third metallic layer 345a. The first metallic layer 343a is disposed on the bottom surface 372 of the core portion 37, and may be formed from a copper foil. The second metallic layer 344a is disposed on the first metallic layer 343a, and may be a plated copper layer. The third metallic layer 345a is disposed on the second metallic layer 344a, and may be another plated copper layer. In some embodiments, the third metallic layer 345a may be omitted.

An L/S of the second lower circuit layer 38a may be greater than or equal to about 10 µm/about 10 µm. Thus, the L/S of the second lower circuit layer 38a may be substantially equal to the L/S of the first upper circuit layer 34, and may be greater than or equal to about five times the L/S of the first circuit layers 24 of the upper conductive structure 2. The second lower circuit layer 38a has a top surface and a bottom surface opposite to the top surface. In some embodiments, the second lower circuit layer 38a is formed or disposed on the bottom surface 302a of the first lower dielectric layer 30a, and covered by the second lower dielectric layer 36a. The top surface of the second lower circuit layer 38a contacts the bottom surface 302a of the first lower dielectric layer 30a. In some embodiments, the second lower circuit layer 38a is electrically connected to the first lower circuit layer 34a through the lower interconnection vias 35a. That is, the lower interconnection vias 35a are disposed between the second lower circuit layer 38a and the first lower circuit layer 34a for electrically connecting the second lower circuit layer 38a and the first lower circuit layer 34a. Further, the second lower circuit layer 38a is electrically connected to the bottom electrical contacts 405 of the electronic devices 40 through the lower interconnection vias 35a. In some embodiments, the second lower circuit layer 38a and the lower interconnection vias 35a are formed integrally as a monolithic or one-piece structure. The lower interconnection vias 35a tapers upwardly along a direction from the bottom surface 32 towards the top surface 31 of the lower conductive structure 3.

In addition, in some embodiments, the top second lower circuit layer 38a' is formed or disposed on the bottom surface 362a of the top second lower dielectric layer 36a, and the bottom second lower circuit layer 38a' is formed or disposed on the bottom surface of the bottom second lower dielectric layer 36a. In some embodiments, the two second lower circuit layers 38a' are electrically connected to the second lower circuit layer 38a through the lower interconnection vias 35a. In some embodiments, each interconnection via 39 electrically connects the first upper circuit layer 34 and the first lower circuit layer 34a. The base metallic layer 391 of the interconnection via 39, the second metallic layer 344 of the first upper circuit layer 34 and the second metallic layer 344a the first lower circuit layer 34a may be formed integrally and concurrently as a monolithic or one-piece structure.

The intermediate layer 12 is interposed or disposed between the upper conductive structure 2 and the lower conductive structure 3 to bond the upper conductive structure 2 and the lower conductive structure 3 together. That is, the intermediate layer 12 adheres to the bottom surface 22 of the upper conductive structure 2 and the top surface 31 of the lower conductive structure 3. In some embodiments, the intermediate layer 12 may be an adhesion layer that is cured from an adhesive material (e.g., includes a cured adhesive material such as an adhesive polymetric material). The intermediate layer 12 has a top surface 121 and a bottom surface 122 opposite to the top surface 121, and defines at least one through hole 123 having an inner surface 1231. The top surface 121 of the intermediate layer 12 contacts the bottom surface 22 of the upper conductive structure 2 (that is, the bottom surface 22 of the upper conductive structure 2 is attached to the top surface 121 of the intermediate layer 12), and the bottom surface 122 of the intermediate layer 12 contacts the top surface 31 of the lower conductive structure 3. Thus, the bottommost first circuit layer 24 of the upper conductive structure 2 and the topmost circuit layer 38 (e.g., the second upper circuit layer 38) of the lower conductive structure 3 are embedded in the intermediate layer 12. In some embodiments, a bonding force between two adjacent dielectric layers (e.g., two adjacent first dielectric layers 20) of the upper conductive structure 2 is greater than a bonding force between a dielectric layer (e.g., the bottommost first dielectric layers 20) of the upper conductive structure 2 and the intermediate layer 12. A surface roughness of a boundary between two adjacent dielectric layers (e.g., two adjacent first dielectric layers 20) of the upper conductive structure 2 is greater than a surface roughness of a boundary between a dielectric layer (e.g., the bottommost first dielectric layers 20) of the upper conductive structure 2 and the intermediate layer 12, such as about 1.1 times or greater, about 1.3 times or greater, or about 1.5 times or greater in terms of root mean squared surface roughness.

In some embodiments, a material of the intermediate layer 12 is transparent, and can be seen through by human eyes or machine. That is, a mark disposed adjacent to the top surface 31 of the lower conductive structure 3 can be recognized or detected from the top surface 21 of the upper conductive structure 2 by human eyes or machine. In some embodiments, a material of the intermediate layer 12 may include Ajinomoto build-up film (ABF).

The through hole 123 extends through the intermediate layer 12. In some embodiments, the through hole 123 of the intermediate layer 12 may extend through the bottommost first circuit layer 24 of the upper conductive structure 2 and terminate at or on a topmost circuit layer (e.g., the second upper circuit layer 38') of the lower conductive structure 3. That is, the through hole 123 of the intermediate layer 12 does not extend through the topmost circuit layer (e.g., the second upper circuit layer 38') of the lower conductive structure 3. The through hole 123 of the intermediate layer 12 may expose a portion of the topmost circuit layer (e.g., the top surface of the second upper circuit layer 38) of the lower conductive structure 3.

As shown in FIG. 1, the through hole 123 of the intermediate layer 12 tapers downwardly along a direction from the top surface 121 towards the bottom surface 122 of the intermediate layer 12; that is, a size of a top portion of the through hole 123 is greater than a size of a bottom portion of the through hole 123. Further, the through hole 123 of the intermediate layer 12 is aligned with and in communication with the through holes 203 of the first dielectric layers 20 and the through hole 263 of the second dielectric layer 26. The bottom portion of the through hole 203 of the bottommost first dielectric layer 20 is disposed adjacent to or connected to the top portion of the through hole 123 of the intermediate layer 12. The size of the bottom portion of the through hole 203 of the bottommost first dielectric layer 20 is substantially equal to the size of the top portion of the through hole 123 of the intermediate layer 12. Thus, the inner surface 1231 of the through hole 123 of the intermediate layer 12 is coplanar or aligned with the inner surfaces 2031 of the through holes 203 of the first dielectric layers 20 and the inner surface 2631 of the through hole 263 of the second dielectric layer 26. In some embodiments, inner surface 1231 of the through hole 123 of the intermediate layer 12 may be a curved surface, and is a portion of an inner surface 231 of the single, continuous through hole 23 for accommodating the upper through via 14. The through hole 123 of the intermediate layer 12, the through hole 203 of the first dielectric layer 20 and the through hole 263 of the second dielectric layer 26 are collectively configured to form or define the single through hole 23. Thus, the single through hole 23 includes the through hole 123 of the intermediate layer 12, the through hole 203 of the first dielectric layer 20 and the through hole 263 of the second dielectric layer 26.

As shown in FIG. 1, cross-sectional views of one side of the through hole 123 of the intermediate layer 12, the inner surfaces 2031 of the through holes 203 of the first dielectric layers 20 and the inner surface 2631 of the through hole 263 of the second dielectric layer 26 are segments of a substantially straight line. That is, cross-sectional views of one side of the inner surface 1231 of the through hole 123 of the intermediate layer 12, the inner surfaces 2031 of the through holes 203 of the first dielectric layers 20 and the inner surface 2631 of the through hole 263 of the second dielectric layer 26 may extend along the same substantially straight line. The single through hole 23 extends through the upper conductive structure 2 and the intermediate layer 12; that is, the single through hole 23 extends from the top surface 21 of the upper conductive structure 2 to the bottom portion of the intermediate layer 12 to expose a portion of the topmost circuit layer (e.g., the top surface of the second upper circuit layer 38) of the lower conductive structure 3. The single through hole 23 tapers downwardly. A maximum width (e.g., at the top portion) of the single through hole 23 may be about 25 μm to about 60 μm.

The upper through via 14 is formed or disposed in the corresponding single through hole 23, and is formed of a metal, a metal alloy, or other conductive material. Thus, the upper through via 14 extends through at least a portion of the upper conductive structure 2 and the intermediate layer 12, and is electrically connected to the topmost circuit layer (e.g., the top surface of the second upper circuit layer 38) of the lower conductive structure 3. As shown in FIG. 1, the upper through via 14 extends through and contacts the bottommost first circuit layer 24 of the upper conductive structure 2, and terminates at or on, and contacts a portion of the topmost circuit layer (e.g., the top surface of the second upper circuit layer 38) of the lower conductive structure 3. The upper through via 14 extends from the top surface 21 of the upper conductive structure 2 to the bottom surface 122 of the intermediate layer 12. Thus, the upper through via 14 extends to contact a portion of the lower conductive structure 3, and the upper through via 14 does not extend through the lower conductive structure 3. In some embodiments, a low-density circuit layer (e.g., the second upper circuit layer 38) of the low-density conductive structure (e.g., the lower conductive structure 3) is electrically connected to a high-density circuit layer (e.g., the bottommost first circuit layer 24) of the high-density conductive structure (e.g., the upper conductive structure 2) solely by the upper through via 14 extending through the high-density circuit layer (e.g., the bottommost first circuit layer 24) of the high-density conductive structure (e.g., the upper conductive structure 2). A length (along a longitudinal axis) of the upper through via 14 is greater than a thickness of the high-density conductive structure (e.g., the upper conductive structure 2). Further, the upper through via 14 tapers downwardly; that is, a size of a top portion of the upper through via 14 is greater than a size of a bottom portion of the upper through via 14. Thus, a tapering direction of the inner via 25 of the upper conductive structure 2 is different from a tapering direction of the upper through via 14. In some embodiments, the upper through via 14 is a monolithic structure or a one-piece structure having a homogeneous material composition, and a peripheral surface of the upper through via 14 is a substantially continuous surface without boundaries. The upper through via 14 and the second circuit layer 28 may be formed integrally as a monolithic or one-piece structure. In some embodiments, a maximum width of the upper through via 14 may be less than about 40 µm, such as about 30 µm or about 20 µm.

Figure 2:
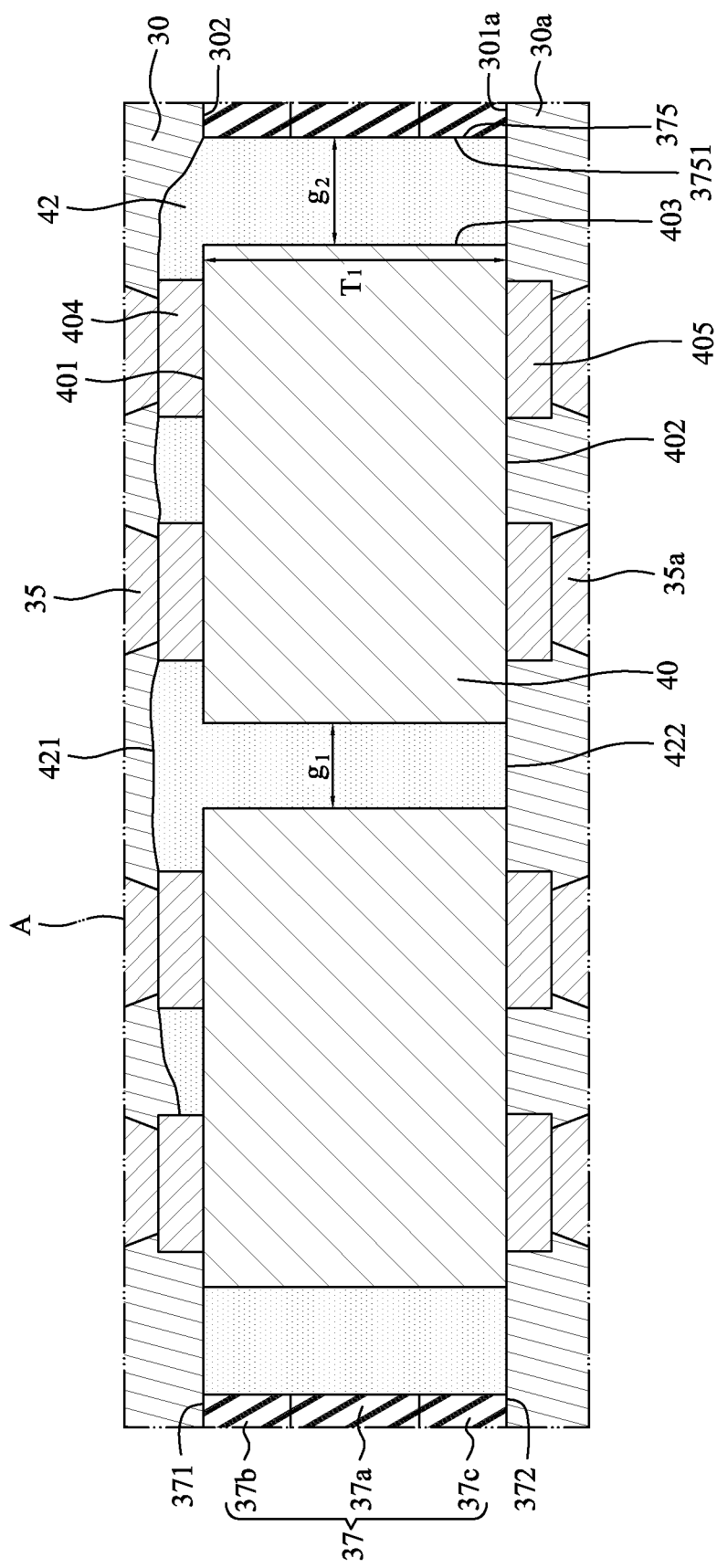
FIG. 2 illustrates an enlarged view of an area "A" shown in FIG. 1.

FIG. 2 illustrates an enlarged view of an area "A" shown in FIG. 1. A thickness of the electronic device 40 or a depth of the cavity 375 of the core portion 37 is defined as "$T_1$", and a gap between the lateral surface 403 of the electronic device 40 and the sidewall 3751 of the cavity 375 of the core portion 37 is defined as "$g_2$". A ratio of the thickness $T_1$ to the gap $g_2$ is greater than 10:1, greater than 100:1, greater than 250:1, or greater than 500:1. In some embodiments, the thickness of the electronic device 40 or a depth of the cavity 375 of the core portion 37 (e.g., the "$T_1$") may be about 500 µm, and the gap between the lateral surface 403 of the electronic device 40 and the sidewall 3751 of the cavity 375 of the core portion 37 (e.g., the "$g_2$") may be about 1~2 µm. In addition, a gap between the lateral surfaces 403 of the adjacent electronic devices 40 is defined as "$g_1$". A ratio of the thickness $T_1$ to the gap $g_1$ is greater than 10:1, greater than 100:1, greater than 250:1, or greater than 500:1. The gap between the lateral surfaces 403 of the electronic devices 40 may be about 1~2 µm.

As shown in the embodiment illustrated in FIG. 1 and FIG. 2, the wiring structure 1 is a combination of the upper conductive structure 2 and the lower conductive structure 3, in which the first circuit layer 24 of the upper conductive structure 2 has fine pitch, high yield and low thickness; and the circuit layers (e.g., the first upper circuit layer 34, the second upper circuit layers 38, the first lower circuit layer 34a and the second lower circuit layers 38a, 38a') of the lower conductive structure 3 have low manufacturing cost. Thus, the wiring structure 1 has an advantageous compromise of yield and manufacturing cost, and the wiring structure 1 has a relatively low thickness. In some embodiments, if a package has 10000 I/O counts, the wiring structure 1 includes three layers of the first circuit layers 24 of the upper conductive structure 2 and six layers of the circuit layers (e.g., the first upper circuit layer 34, the second upper circuit layers 38, the first lower circuit layer 34a and the three second lower circuit layers 38a, 38a') of the lower conductive structure 3. The manufacturing yield for one layer of the first circuit layers 24 of the upper conductive structure 2 may be 99%, and the manufacturing yield for one layer of the circuit layers (e.g., the first upper circuit layer 34, the second upper circuit layers 38, the first lower circuit layer 34a and the three second lower circuit layers 38a, 38a') of the lower conductive structure 3 may be 90%. Thus, the yield of the wiring structure 1 may be improved. In addition, the warpage of the upper conductive structure 2 and the warpage of the lower conductive structure 3 are separated and will not influence each other. In some embodiments, a warpage shape of the upper conductive structure 2 may be different from a warpage shape of the lower conductive structure 3. For example, the warpage shape of the upper conductive structure 2 may be a convex shape, and the warpage shape of the lower conductive structure 3 may be a concave shape. In some embodiments, the warpage shape of the upper conductive structure 2 may be the same as the warpage shape of the lower conductive structure 3; however, the warpage of the lower conductive structure 3 will not be accumulated onto the warpage of the upper conductive structure 2. Thus, the yield of the wiring structure 1 may be further improved.

In addition, during a manufacturing process, the lower conductive structure 3 and the upper conductive structure 2 may be tested individually before being bonded together. Therefore, known good lower conductive structure 3 and known good upper conductive structure 2 may be selectively bonded together. Bad (or unqualified) lower conductive structure 3 and bad (or unqualified) upper conductive structure 2 may be discarded. As a result, the yield of the wiring structure 1 may be further improved.

In addition, the electronic devices 40 are embedded in the cavity 375; thus, the power loss can be reduced. Further, the upper through via 14 can be used as an electrical connection path and a heat dissipating path.

Figure 3:
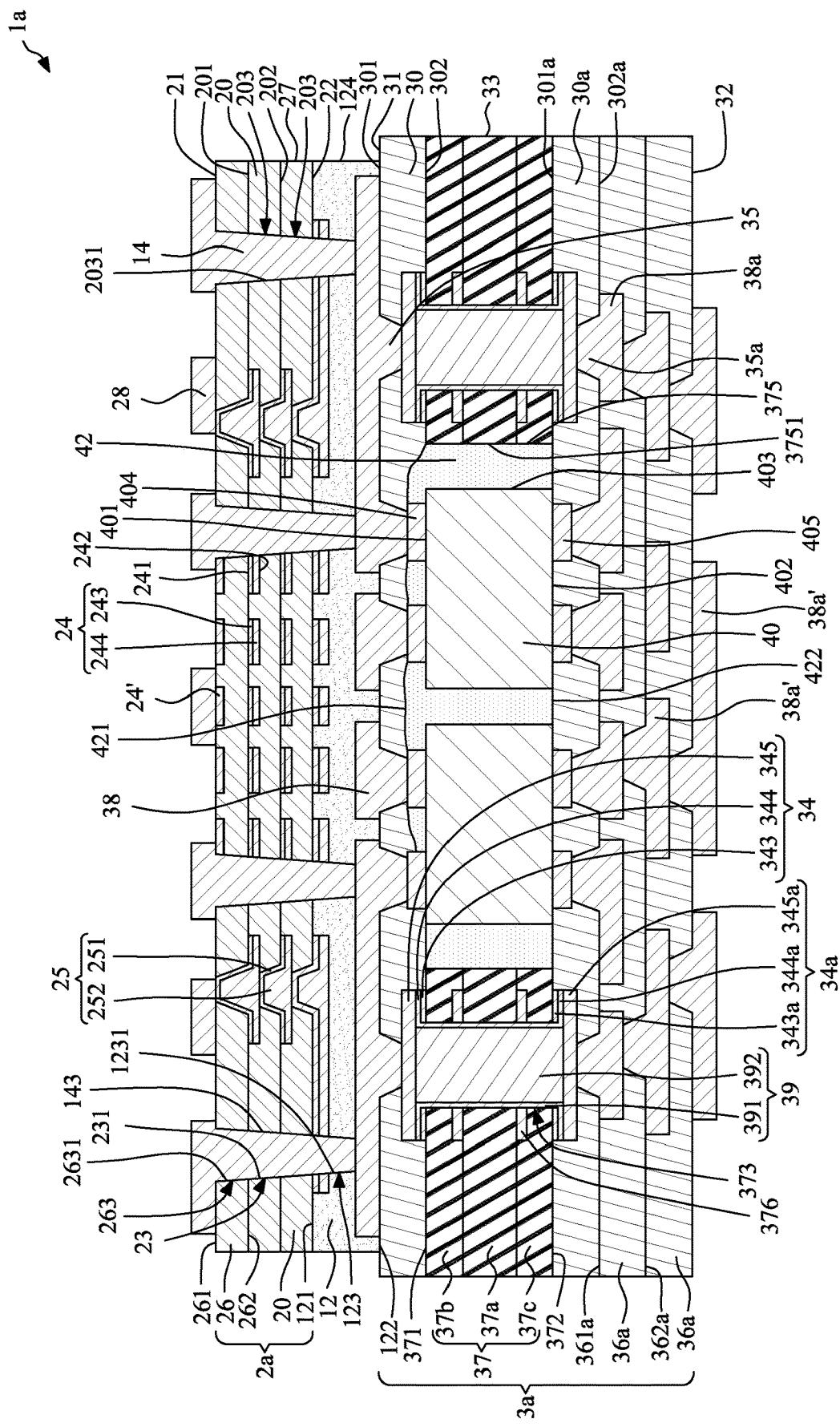
FIG. 3 illustrates a cross-sectional view of a wiring structure according to some embodiments of the present disclosure.

FIG. 3 illustrates a cross-sectional view of a wiring structure 1a according to some embodiments of the present disclosure. The wiring structure 1a is similar to the wiring structure 1 shown in FIG. 1, except for structures of an upper conductive structure 2a and a lower conductive structure 3a. As shown in FIG. 3, the upper conductive structure 2a and the lower conductive structure 3a are both strip structures. Thus, the wiring structure 1a is a strip structure. In some embodiments, the lower conductive structure 3a may be a panel structure that carries a plurality of strip upper conductive structures 2a. Thus, the wiring structure 1a is a panel structure. A length (e.g., about 240 mm) of the upper conductive structure 2a is greater than a width (e.g., about 95 mm) of the upper conductive structure 2a from a top view. Further, a length of the lower conductive structure 3a is greater than a width of the lower conductive structure 3a from a top view. In addition, a lateral peripheral surface 27 of the upper conductive structure 2a is not coplanar with (e.g., is inwardly recessed from or otherwise displaced from) a lateral peripheral surface 33 of the lower conductive structure 3a. In some embodiments, during a manufacturing process, the lower conductive structure 3a and the upper conductive structure 2a may be both known good strip structures. Alternatively, the upper conductive structure 2a may be a known good strip structure, and the lower conductive structure 3a may be a known good panel structure. As a result, the yield of the wiring structure 1a may be further improved.

Figure 4:
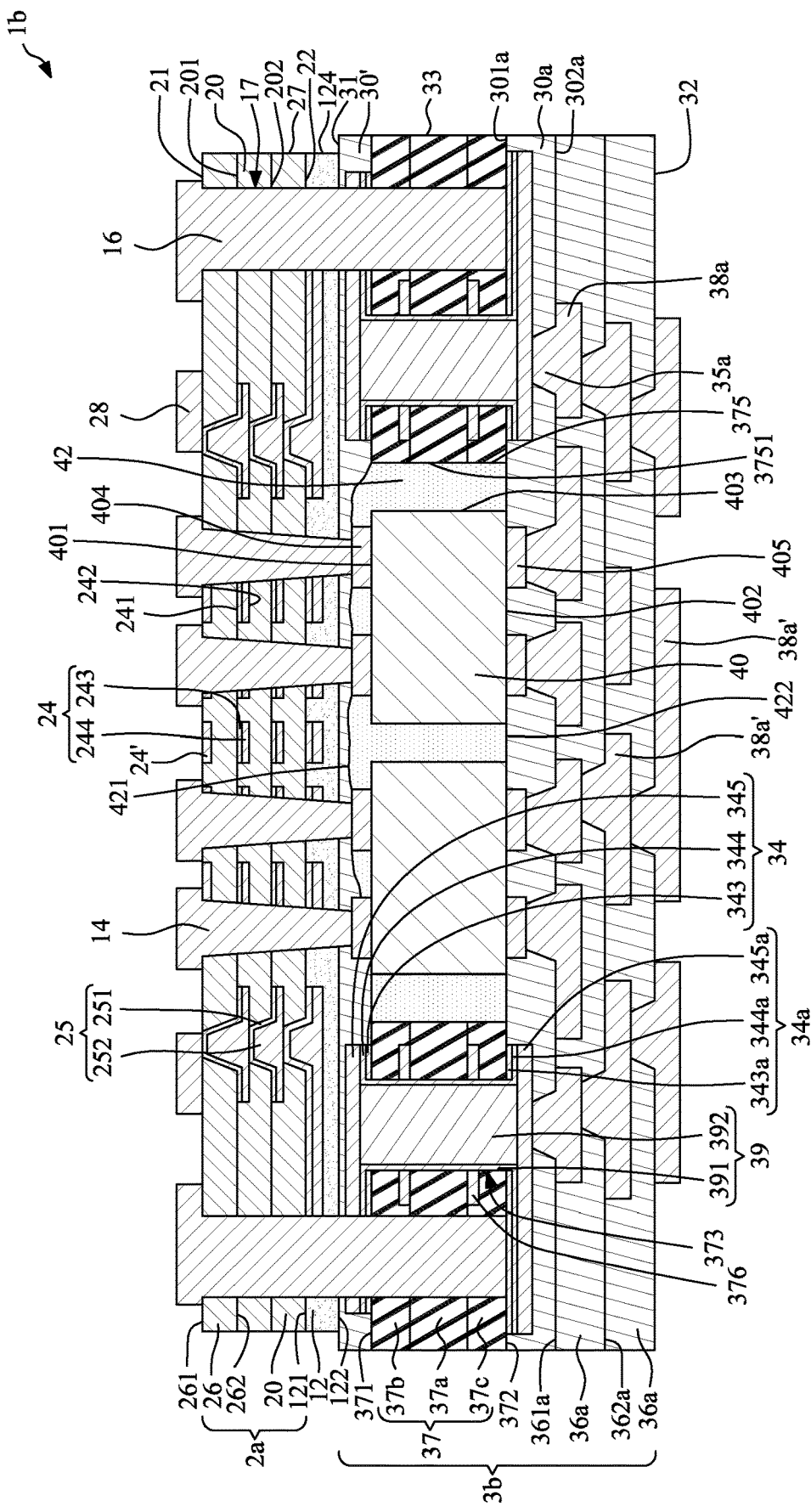
FIG. 4 illustrates a cross-sectional view of a wiring structure according to some embodiments of the present disclosure.

FIG. 4 illustrates a cross-sectional view of a wiring structure 1b according to some embodiments of the present disclosure. The wiring structure 1b is similar to the wiring structure 1a shown in FIG. 3, except for a structure of a lower conductive structure 3b. In the lower conductive structure 3b, the second upper circuit layer 38 is omitted. Further, the first upper dielectric layer 30 (FIG. 3) is thinned to become a first upper dielectric layer 30'. Thus, the top surface 31 of the lower conductive structure 3b is the top surface of the first upper dielectric layer 30', which is substantially flat.

In addition, the upper through vias 14 contact respective ones of the top electrical contacts 404 of the electronic devices 40. That is, each of the upper through vias 14 terminates at or on each of the top electrical contacts 404 of the electronic devices 40. As shown in FIG. 4, the wiring structure 1b further includes a plurality of through vias 16 extending through the upper conductive structure 2a and the core portion 37 of the lower conductive structure 3b. The through via 16 terminates at or on, and contacts the first lower circuit layer 34a of the lower conductive structure 3b.

Figure 5:
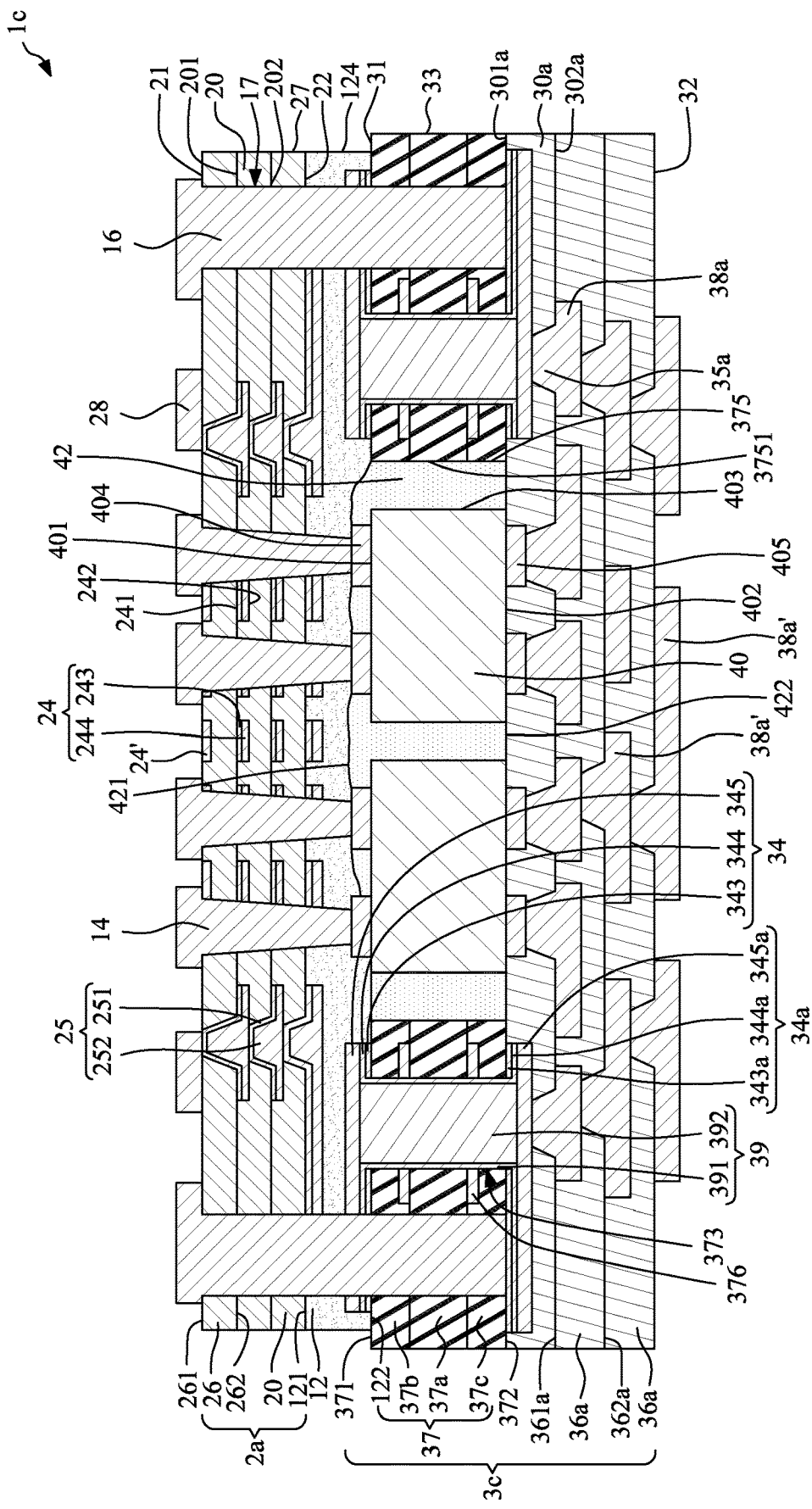
FIG. 5 illustrates a cross-sectional view of a wiring structure according to some embodiments of the present disclosure.

FIG. 5 illustrates a cross-sectional view of a wiring structure 1c according to some embodiments of the present disclosure. The wiring structure 1c is similar to the wiring structure 1b shown in FIG. 4, except for a structure of a lower conductive structure 3c. In the lower conductive structure 3c, the first upper dielectric layer 30' is omitted. Thus, the top surface 31 of the lower conductive structure 3c is the top surface 371 of the core portion 37. As shown in FIG. 5, the bottom surface 122 of the intermediate 12 contacts the top surface 371 of the core portion 37, the first upper circuit layer 34 and the top surface 421 of the filling material 42.

Figure 6:
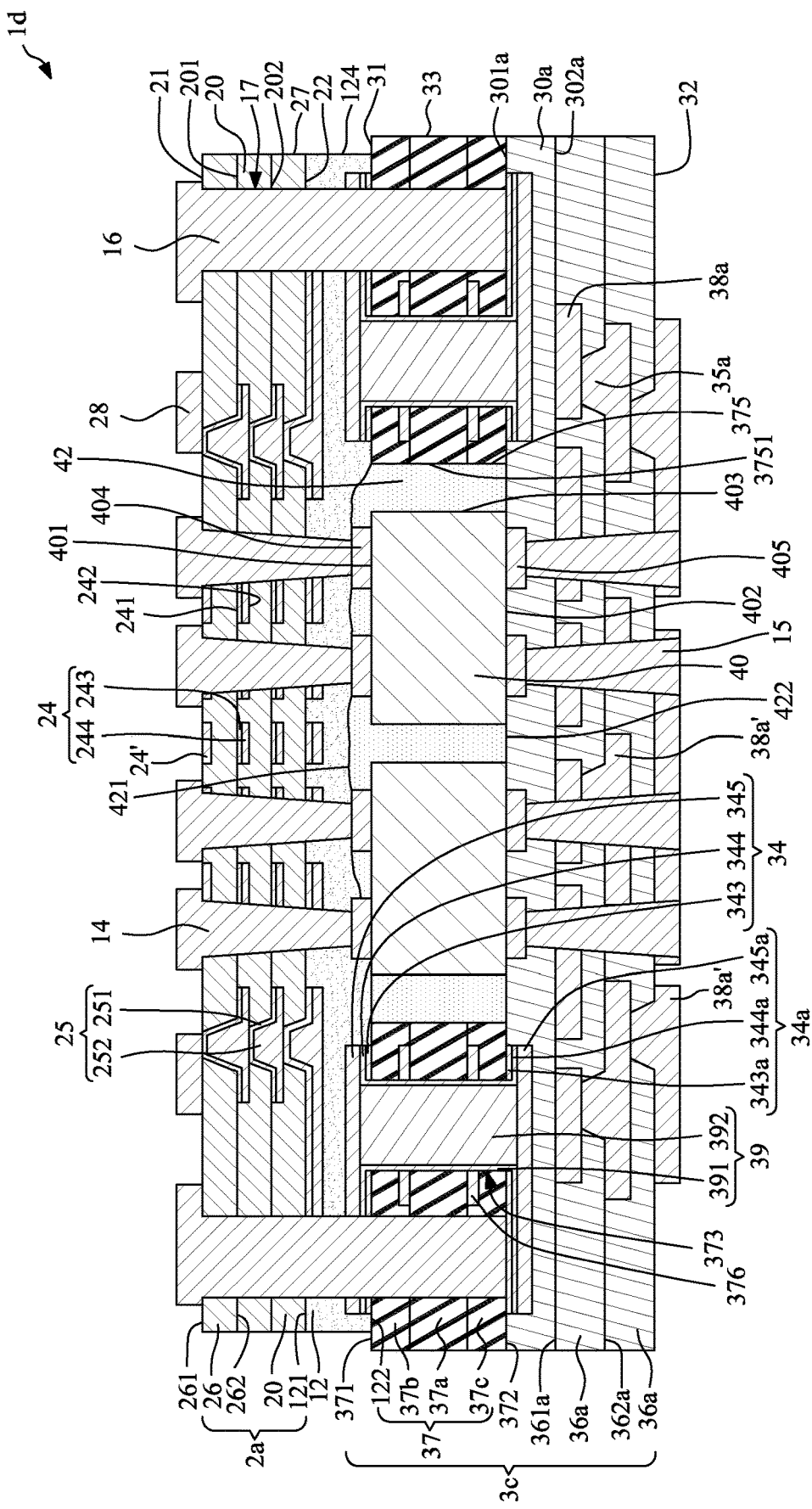
FIG. 6 illustrates a cross-sectional view of a wiring structure according to some embodiments of the present disclosure.

FIG. 6 illustrates a cross-sectional view of a wiring structure 1d according to some embodiments of the present disclosure. The wiring structure 1d is similar to the wiring structure 1c shown in FIG. 5, except that a plurality of lower through vias 15 are further included. The lower through vias 15 extend through the first lower dielectric layer 30a and the two second lower dielectric layers 36a of the lower conductive structure 3, and contact respective ones of the bottom electrical contacts 405 of the electronic devices 40. That is, each of the lower through vias 15 terminates at or on each of the bottom electrical contacts 405 of the electronic devices 40.

Figure 7:
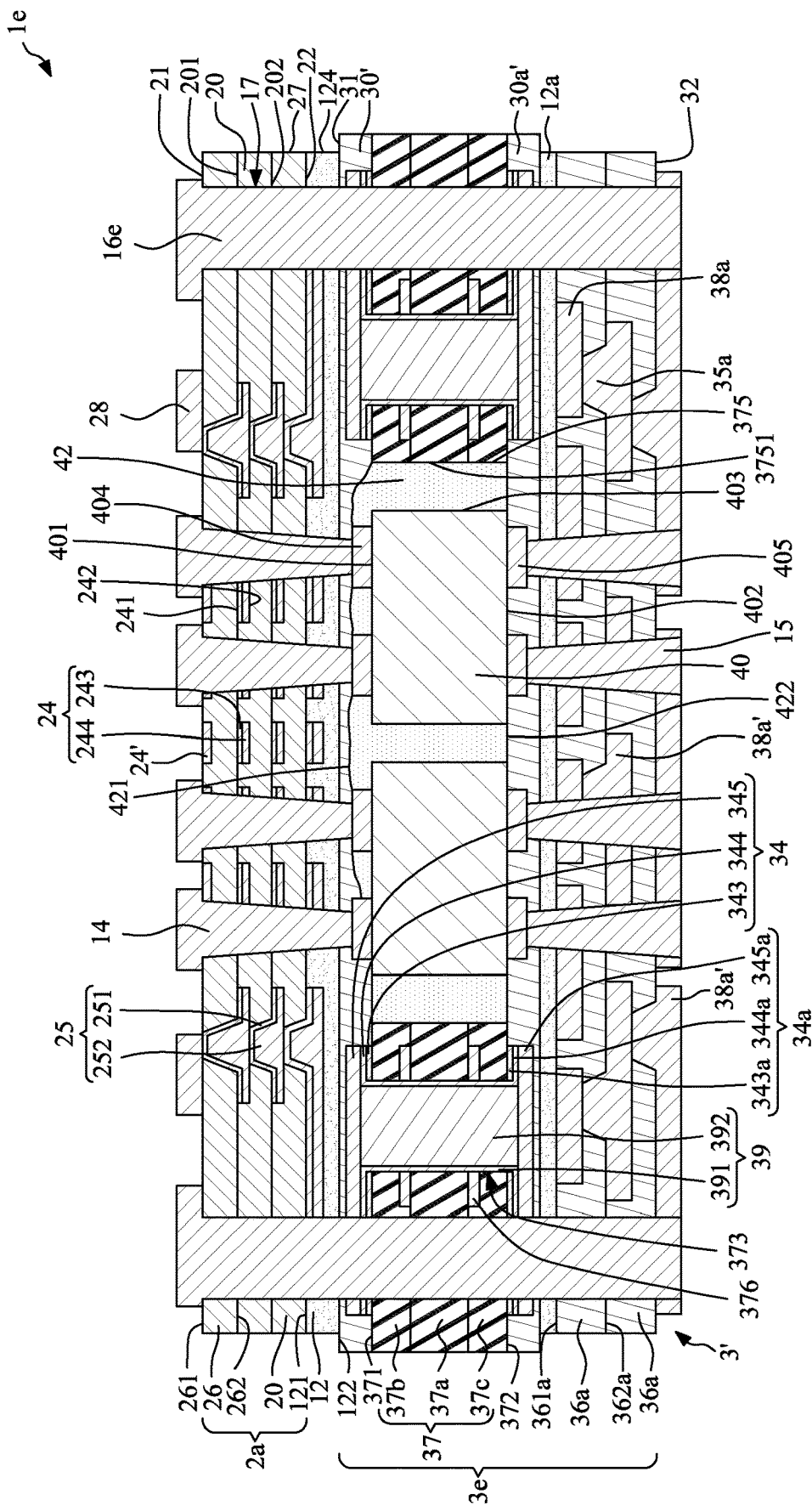
FIG. 7 illustrates a cross-sectional view of a wiring structure according to some embodiments of the present disclosure.

FIG. 7 illustrates a cross-sectional view of a wiring structure 1e according to some embodiments of the present disclosure. The wiring structure 1e is similar to the wiring structure 1b shown in FIG. 4, except for a structure of a lower conductive structure 3e. In the lower conductive structure 3e, the first lower dielectric layer 30a (FIG. 4) is thinned to become a first lower dielectric layer 30a'. Further, a circuit structure 3' including the two second lower dielectric layers 36a and the three second lower circuit layers 38a, 38a' is attached to the first lower dielectric layer 30a' through an intervening layer 12a (e.g., an adhesion layer). As shown in FIG. 7, a lateral peripheral surface of the circuit structure 3' is not coplanar with (e.g., is inwardly recessed from or otherwise displaced from) a lateral peripheral surface of the core portion 37. In addition, a plurality of lower through vias 15 are further included. The lower through vias 15 extend through the first lower dielectric layer 30a', the intervening layer 12a and the circuit structure 3', and contact respective ones of the bottom electrical contacts 405 of the electronic devices 40. That is, each of the lower through vias 15 terminates at or on each of the bottom electrical contacts 405 of the electronic devices 40. As shown in FIG. 7, the through vias 16e extend through the upper conductive structure 2a and the lower conductive structure 3e.

Figure 8:
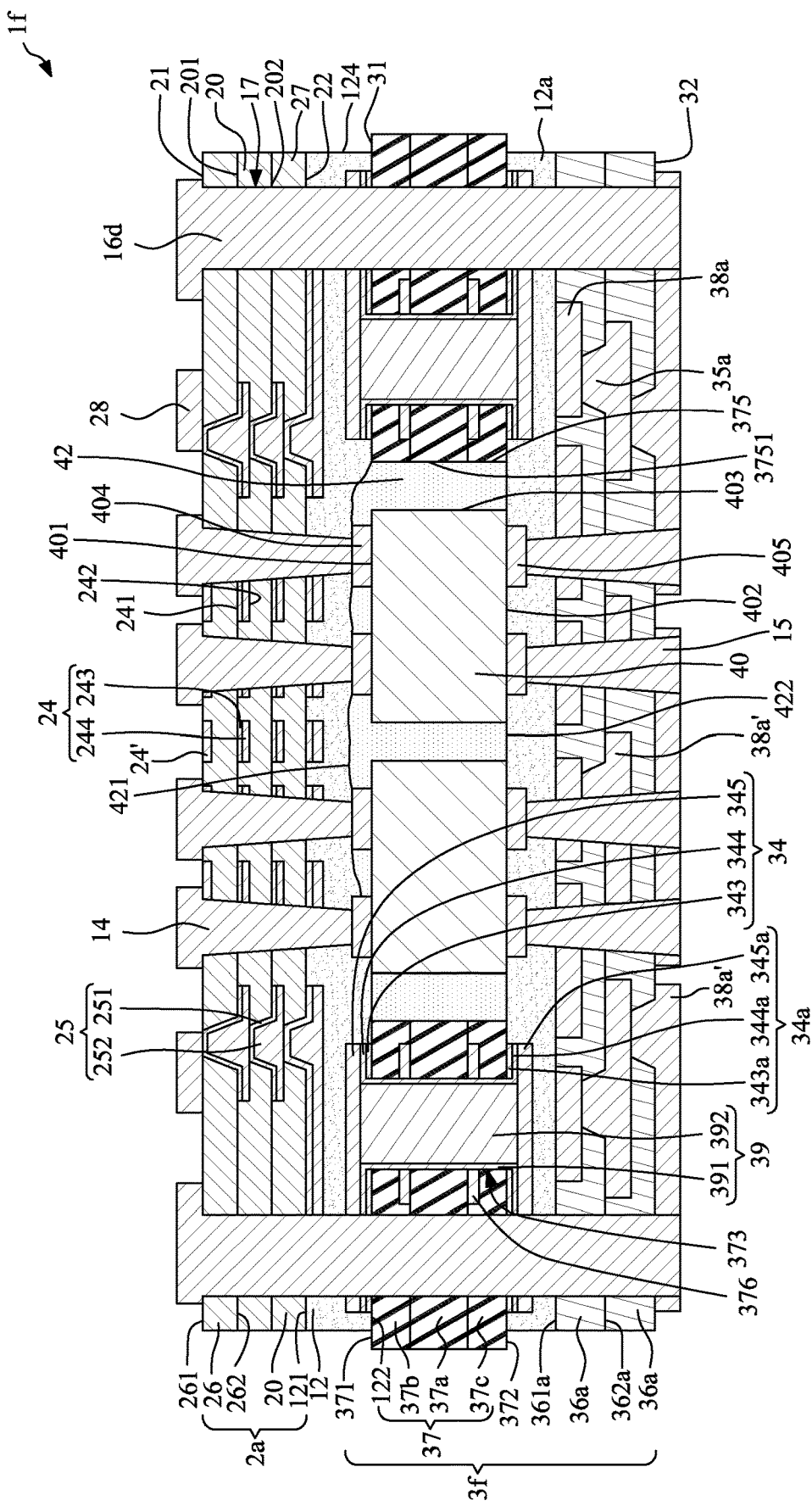
FIG. 8 illustrates a cross-sectional view of a wiring structure according to some embodiments of the present disclosure.

FIG. 8 illustrates a cross-sectional view of a wiring structure 1f according to some embodiments of the present disclosure. The wiring structure 1f is similar to the wiring structure 1e shown in FIG. 7, except for a structure of a lower conductive structure 3f. In the lower conductive structure 3f, the first upper dielectric layer 30' and the first lower dielectric layer 30a' are omitted. As shown in FIG. 8, the bottom surface 122 of the intermediate 12 contacts the top surface 371 of the core portion 37, the first upper circuit layer 34 and the top surface 421 of the filling material 42. Further, the top surface of the intervening layer 12a contacts the bottom surface 372 of the core portion 37, the first lower circuit layer 34a, the bottom surface 422 of the filling material 42 and the bottom surfaces 402 of the electronic devices 40.

Figure 9:
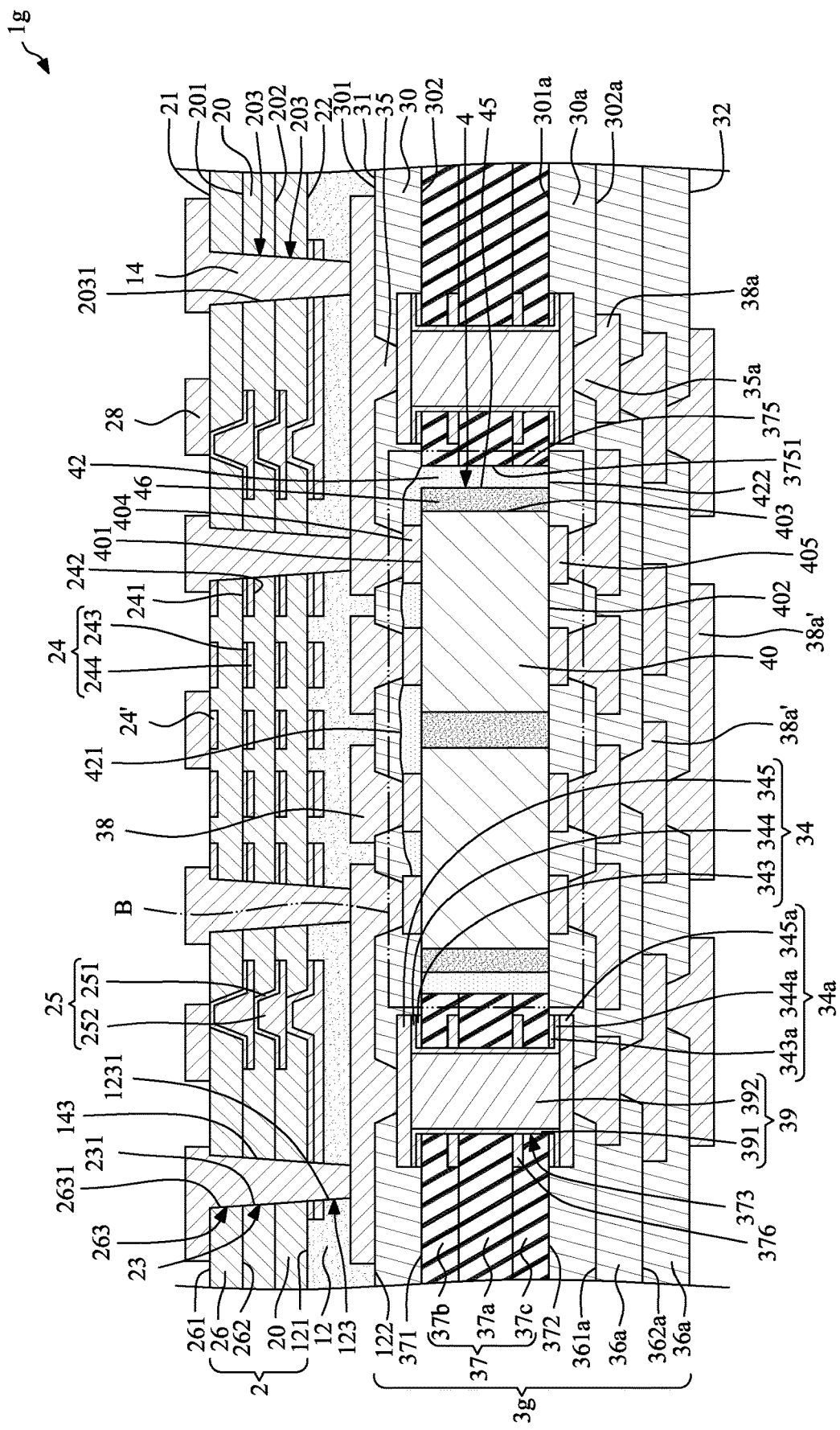
FIG. 9 illustrates a cross-sectional view of a wiring structure according to some embodiments of the present disclosure.

FIG. 9 illustrates a cross-sectional view of a wiring structure 1g according to some embodiments of the present disclosure. The wiring structure 1g is similar to the wiring structure 1 shown in FIG. 1, except for a structure of a lower conductive structure 3g. In the lower conductive structure 3g, an encapsulant 46 (e.g., a molding compound) is further included to encapsulate the electronic devices 40 to form a module 4. Thus, the lower conductive structure 3g includes the module 4, and the module 4 includes a plurality of known good electronic devices 40 and the encapsulant 46 encapsulating the known good electronic devices 40. As shown in FIG. 9, the encapsulant 46 does not completely cover the electrical contact (e.g., the top electrical contacts 404 and the bottom electrical contacts 405). Thus, the electrical contact (e.g., the top electrical contacts 404 and the bottom electrical contacts 405) may be exposed from the encapsulant 46. A top surface of the encapsulant 46 may be substantially coplanar with the bottom surfaces 402 of the electronic devices 40, and a bottom surface of the encapsulant 46 may be substantially coplanar with the bottom surfaces 402 of the electronic devices 40.

The module 4 is disposed in the cavity 375 of the core portion 37. The module 4 has a lateral surface 45. The filling material 42 is disposed between the lateral surface 45 of the module 4 and the sidewall 3751 of the cavity 375 of the core portion 37. A portion of the filling material 42 may extend to the top surface of the module 4. That is, the top surface 421 of the filling material 42 may be higher than the top surface of the module 4. However, the filling material 42 does not completely cover the electrical contact (e.g., the top electrical contacts 404 and the bottom electrical contacts 405). Thus, the electrical contact (e.g., the top electrical contacts 404 and the bottom electrical contacts 405) may be exposed from the filling material 42. As shown in FIG. 9, the bottom surface 422 of the filling material 42 may be substantially coplanar with the bottom surface of the module 4. In some embodiments, a material of the encapsulant 46 may be same as or different from a material of the filling material 42.

Figure 10:
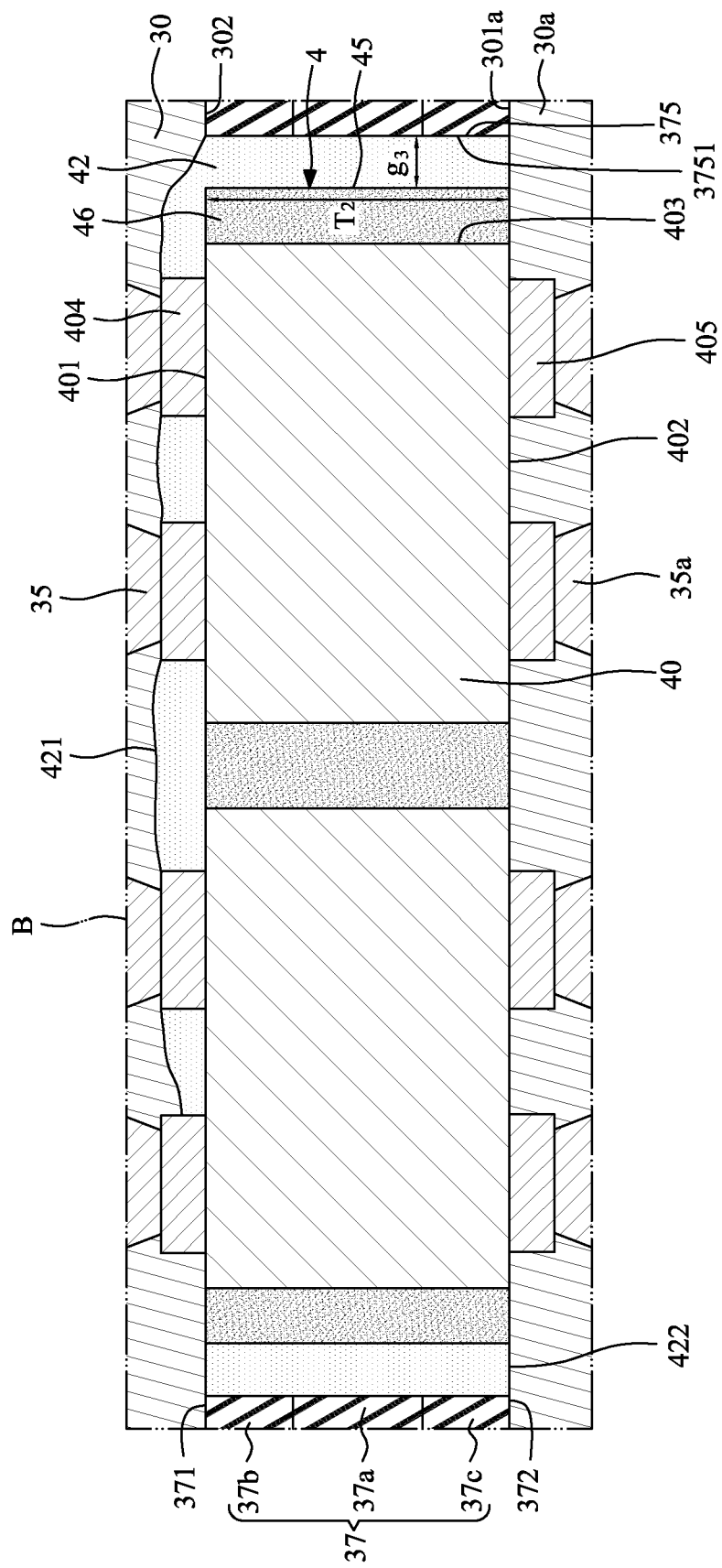
FIG. 10 illustrates an enlarged view of an area "B" shown in FIG. 9.

FIG. 10 illustrates an enlarged view of an area "B" shown in FIG. 9. A thickness of the module 4 is defined as "$T_2$", and a gap between the lateral surface 45 of the module 4 and the sidewall 3751 of the cavity 375 of the core portion 37 is defined as "$g_3$". A ratio of the thickness $T_2$ to the gap $g_3$ is greater than 10:1, greater than 100:1, greater than 250:1, or greater than 500:1. In some embodiments, the thickness of the module 4 (e.g., the "$T_2$") may be about 500 μm, and the gap between the lateral surface 45 of the module 4 and the sidewall 3751 of the cavity 375 of the core portion 37 (e.g., the "$g_3$") may be less than 2 μm, or less than 1 μm.

Figure 11:
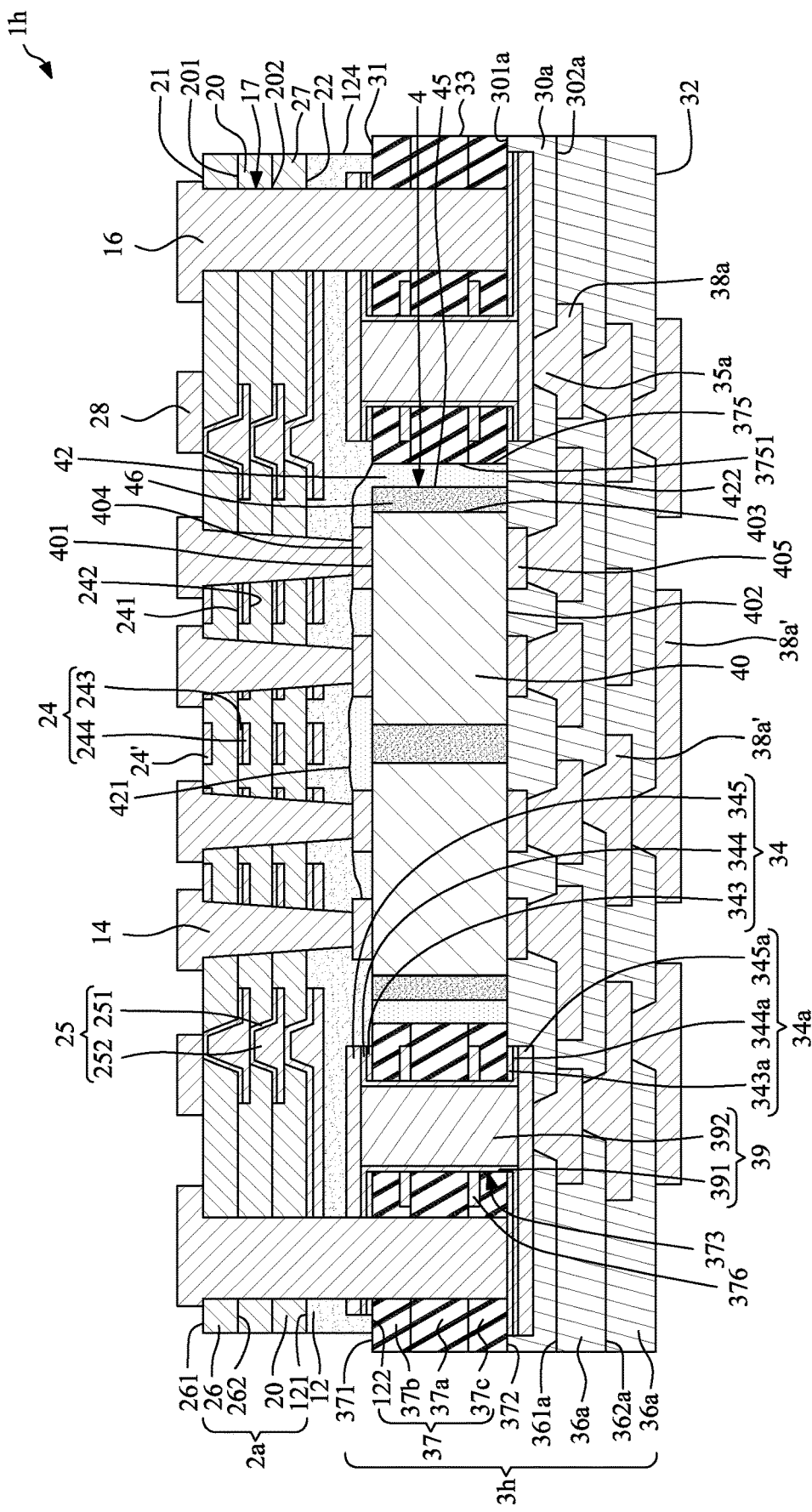
FIG. 11 illustrates a cross-sectional view of a wiring structure according to some embodiments of the present disclosure.

FIG. 11 illustrates a cross-sectional view of a wiring structure 1h according to some embodiments of the present disclosure. The wiring structure 1h is similar to the wiring structure 1c shown in FIG. 5, except for a structure of a lower conductive structure 3h. In the lower conductive structure 3h, an encapsulant 46 (e.g., a molding compound) is further included to encapsulate the electronic devices 40 to form a module 4. Thus, the lower conductive structure 3h includes the module 4, and the module 4 includes a plurality of known good electronic devices 40 and the encapsulant 46 encapsulating the known good electronic devices 40. The module 4 of FIG. 11 may be substantially same as the module 4 of FIG. 9.

Figure 12:
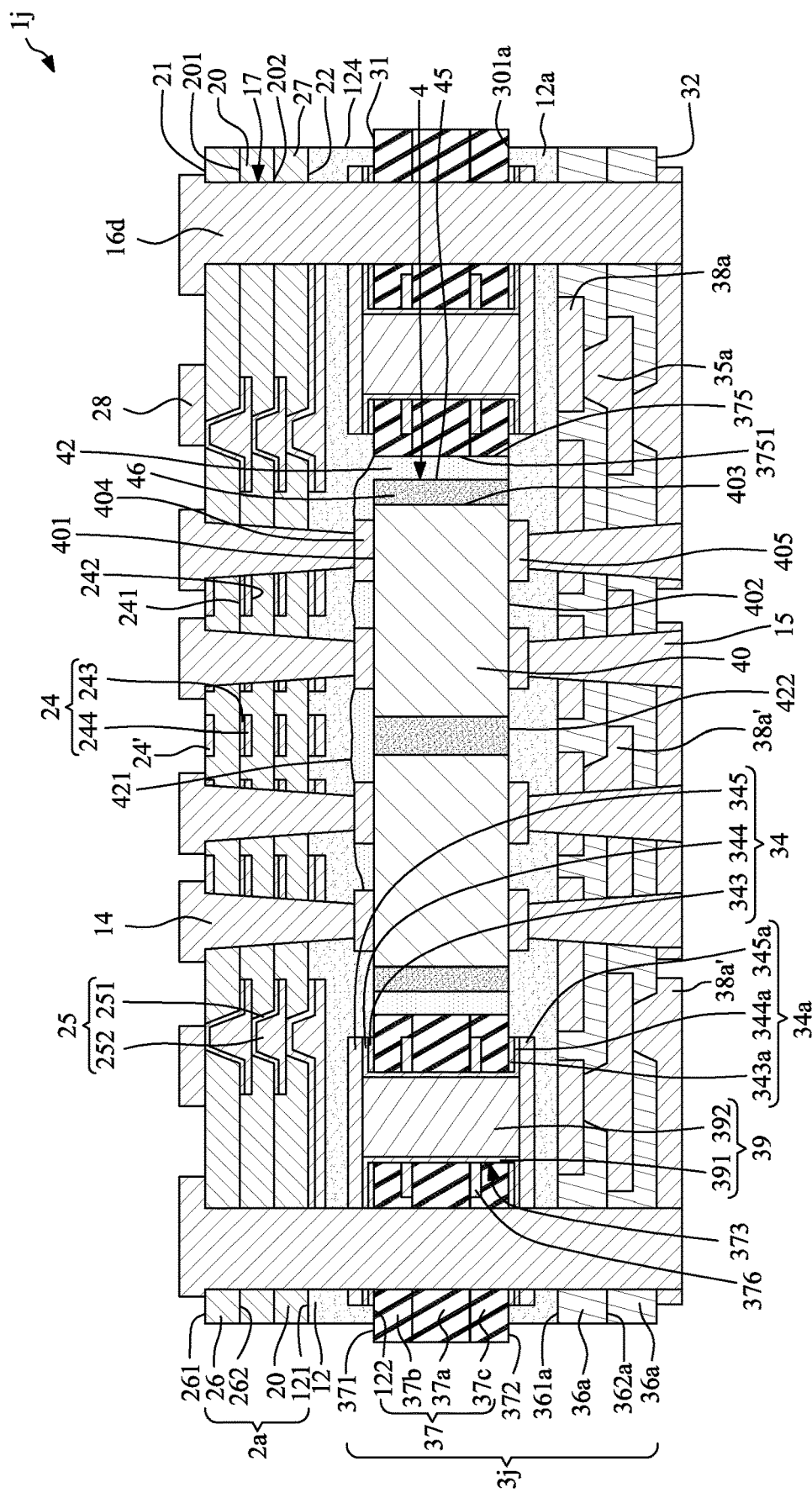
FIG. 12 illustrates a cross-sectional view of a wiring structure according to some embodiments of the present disclosure.

FIG. 12 illustrates a cross-sectional view of a wiring structure 1j according to some embodiments of the present disclosure. The wiring structure 1j is similar to the wiring structure 1f shown in FIG. 8, except for a structure of a lower conductive structure 3j. In the lower conductive structure 3j, an encapsulant 46 (e.g., a molding compound) is further included to encapsulate the electronic devices 40 to form a module 4. Thus, the lower conductive structure 3j includes the module 4, and the module 4 includes a plurality of known good electronic devices 40 and the encapsulant 46 encapsulating the known good electronic devices 40. The module 4 of FIG. 12 may be substantially same as the module 4 of FIG. 9.

FIG. 13 through FIG. 50 illustrate a method for manufacturing a wiring structure according to some embodiments of the present disclosure. In some embodiments, the method is for manufacturing the wiring structure 1 shown in FIG. 1.

Figure 13:
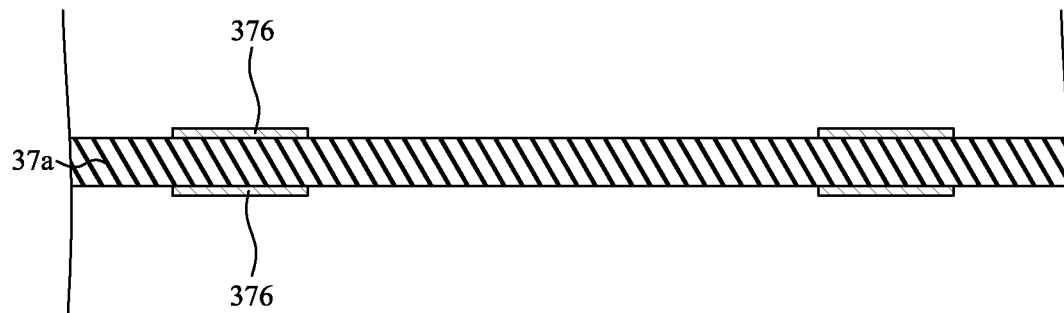
FIG. 13 illustrates one or more stages of an example of a method for manufacturing a wiring structure according to some embodiments of the present disclosure.

Referring to FIG. 13 through FIG. 34, a lower conductive structure 3 is provided. The lower conductive structure 3 is manufactured as follows. Referring to FIG. 13, a first core material layer 37a with a top copper foil 50 and a bottom copper foil 52 is provided. 376

Referring to FIG. 13, a first core material layer 37a with two inner circuit layers 376 is provided.

Figure 14:
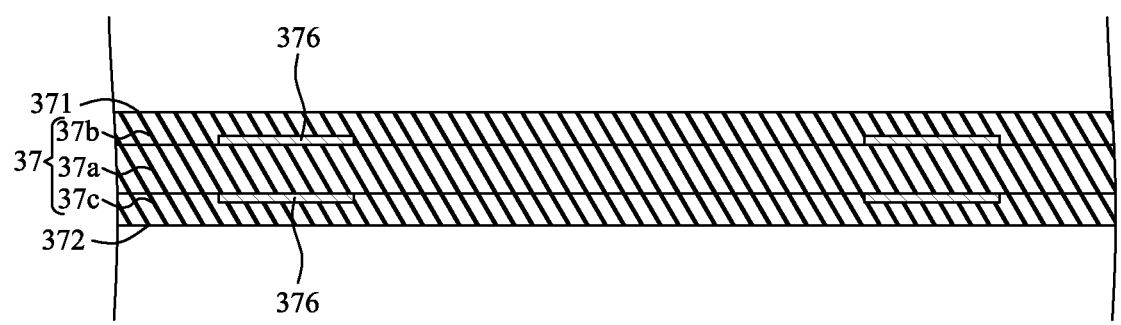
FIG. 14 illustrates one or more stages of an example of a method for manufacturing a wiring structure according to some embodiments of the present disclosure.

Referring to FIG. 14, a second core material layer 37b and a third core material layer 37c are disposed on the top surface and bottom surface of the first core material layer 37a to cover the inner circuit layers 376, so as to form a core portion 37. The core portion 37 may be in a wafer type, a panel type or a strip type. The core portion 37 has a top surface 371 and a bottom surface 372 opposite to the top surface 371.

Figure 15:
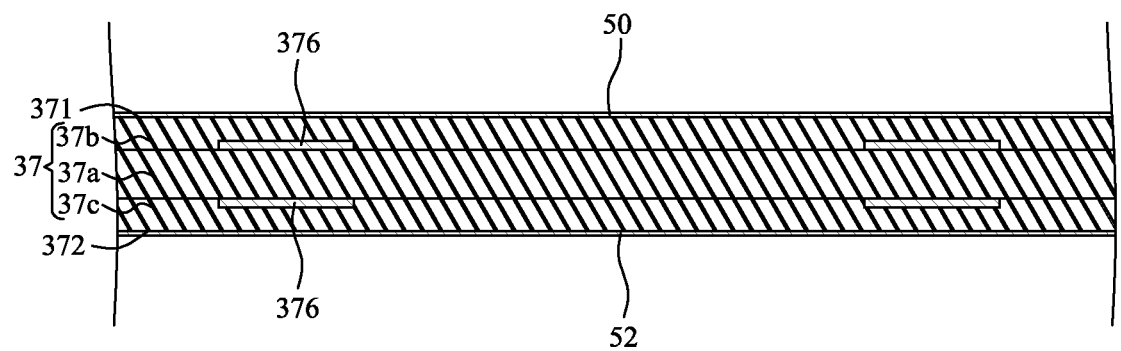
FIG. 15 illustrates one or more stages of an example of a method for manufacturing wiring structure according to some embodiments of the present disclosure.

Referring to FIG. 15, a top copper foil 50 is disposed on the top surface 371 of the core portion 37, and a bottom copper foil 52 is disposed on the bottom surface 372 of the core portion 37.

Figure 16:
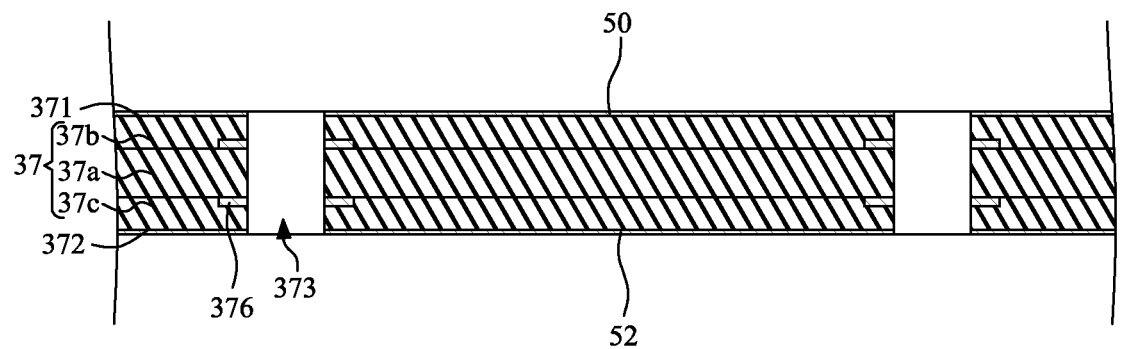
FIG. 16 illustrates one or more stages of an example of a method for manufacturing a wiring structure according to some embodiments of the present disclosure.

Referring to FIG. 16, a plurality of through holes 373 are formed to extend through the core portion 37, the top copper foil 50 and the bottom copper foil 52 by a drilling technique (such as laser drilling or mechanical drilling) or other suitable techniques.

Figure 17:
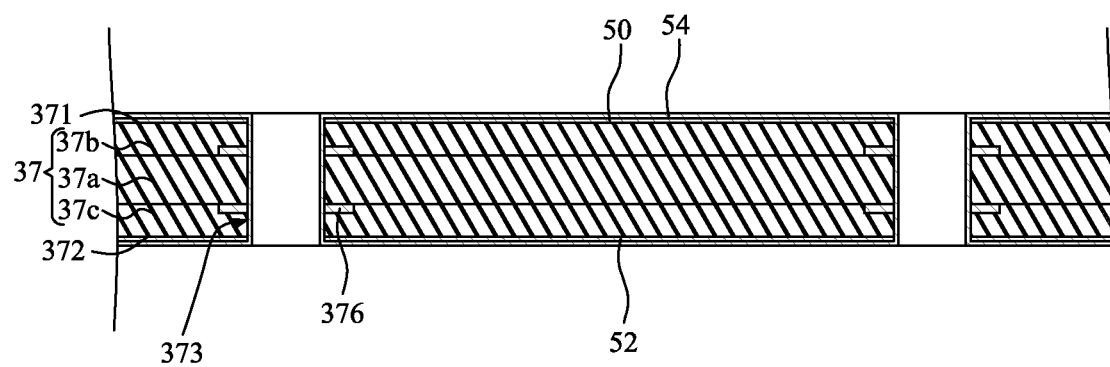
FIG. 17 illustrates one or more stages of an example of a method for manufacturing a wiring structure according to some embodiments of the present disclosure.

Referring to FIG. 17, a second metallic layer 54 is formed or disposed on the top copper foil 50, the bottom copper foil 52 and side walls of the first through holes 373 by a plating technique or other suitable techniques. A portion of the second metallic layer 54 on the side wall of each first through hole 373 defines a central through hole.

Figure 18:
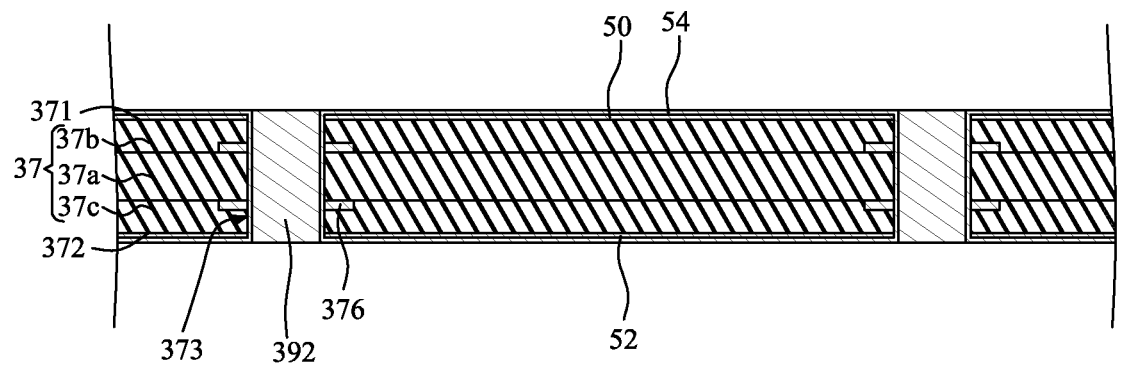
FIG. 18 illustrates one or more stages of an example of a method for manufacturing a wiring structure according to some embodiments of the present disclosure.

Referring to FIG. 18, an insulation material 392 is disposed to fill the central through hole defined by the second metallic layer 54.

Figure 19:
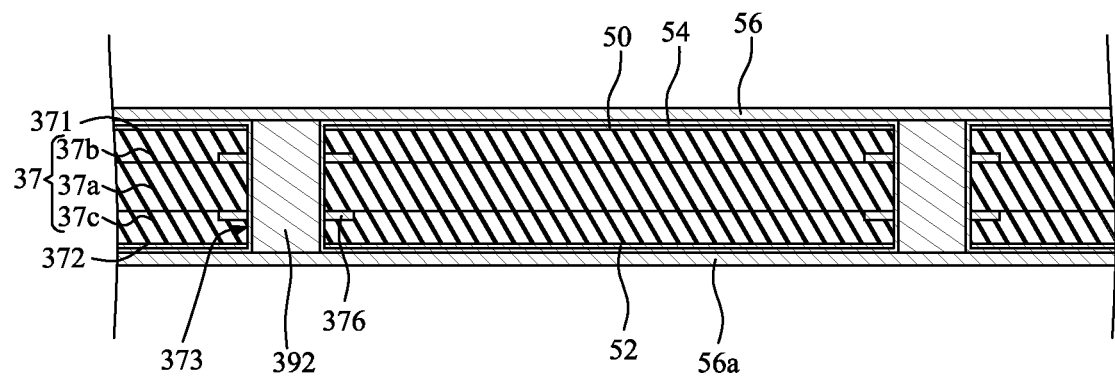
FIG. 19 illustrates one or more stages of an example of a method for manufacturing a wiring structure according to some embodiments of the present disclosure.

Referring to FIG. 19, a top third metallic layer 56 and a bottom third metallic layer 56a are formed or disposed on the second metallic layer 54 by a plating technique or other suitable techniques. The third metallic layers 56, 56a cover the insulation material 392.

Figure 20:
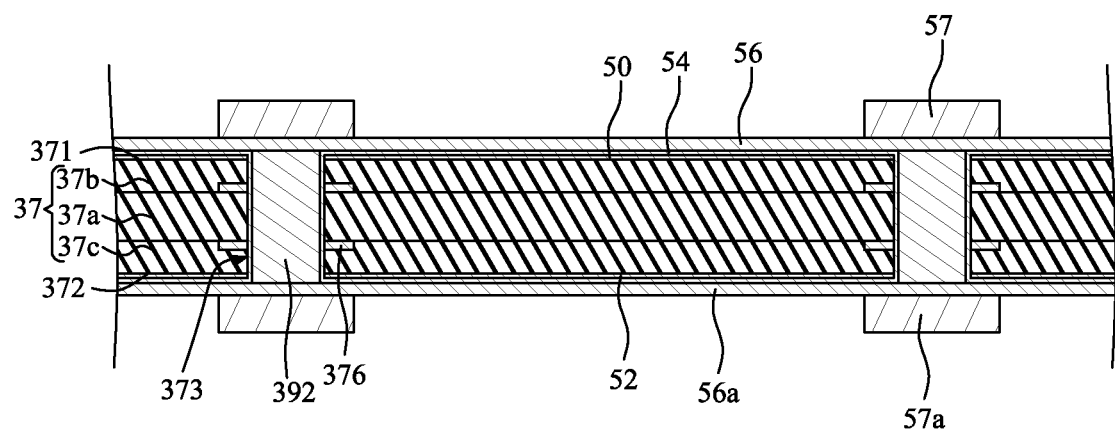
FIG. 20 illustrates one or more stages of an example of a method for manufacturing a wiring structure according to some embodiments of the present disclosure.

Referring to FIG. 20, a top photoresist layer 57 is formed or disposed on the top third metallic layer 56, and a bottom photoresist layer 57a is formed or disposed on the bottom third metallic layer 56a. Then, the photoresist layers 57, 57a are patterned by exposure and development.

Figure 21:
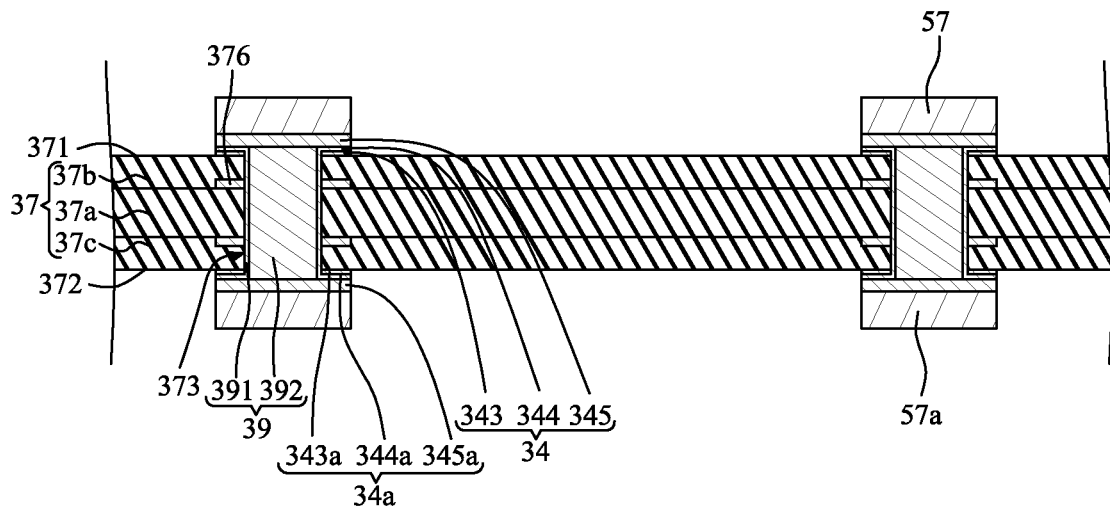
FIG. 21 illustrates one or more stages of an example of a method for manufacturing a wiring structure according to some embodiments of the present disclosure.

Referring to FIG. 21, portions of the top copper foil 50, the second metallic layer 54 and the top third metallic layer 56 that are not covered by the top photoresist layer 57 are removed by an etching technique or other suitable techniques. Portions of the top copper foil 50, the second metallic layer 54 and the top third metallic layer 56 that are covered by the top photoresist layer 57 remain to form a first upper circuit layer 34. Meanwhile, portions of the bottom copper foil 52, the second metallic layer 54 and the bottom third metallic layer 56a that are not covered by the bottom photoresist layer 57a are removed by an etching technique or other suitable techniques. Portions of the bottom copper foil 52, the second metallic layer 54 and the bottom third metallic layer 56a that are covered by the bottom photoresist layer 57a remain to form a first lower circuit layer 34a. Meanwhile, portions of the second metallic layer 54 and the insulation material 392 that are disposed in the through hole 373 form an interconnection via 39. The interconnection via 39 includes a base metallic layer 391 formed from the second metallic layer 54 and the insulation material 392. In some embodiments, the interconnection via 39 may include a bulk metallic material that fills the through hole 373. The interconnection via 39 electrically connects the first upper circuit layer 34 and the first lower circuit layer 34a.

Figure 22:
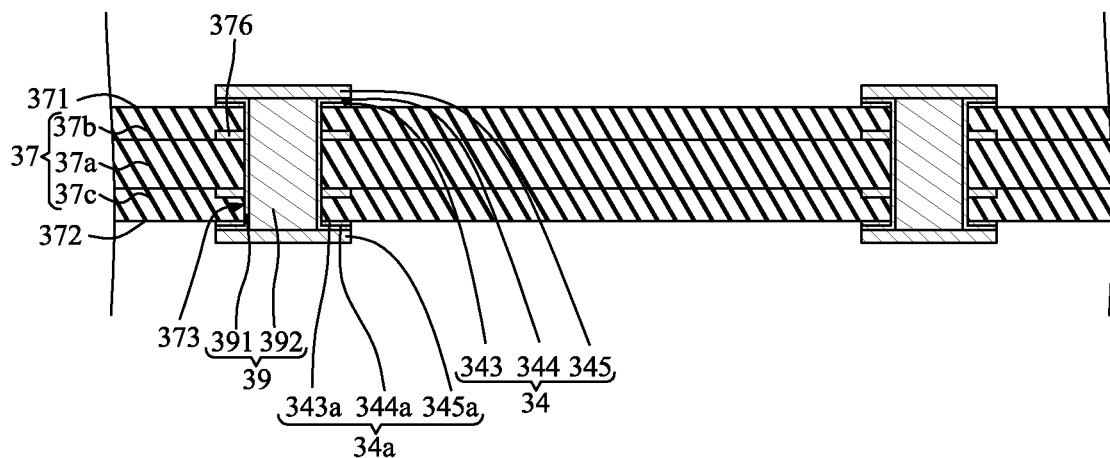
FIG. 22 illustrates one or more stages of an example of a method for manufacturing a wiring structure according to some embodiments of the present disclosure.

Referring to FIG. 22, the top photoresist layer 57 and the bottom photoresist layer 57a are removed by a stripping technique or other suitable techniques.

Figure 23:
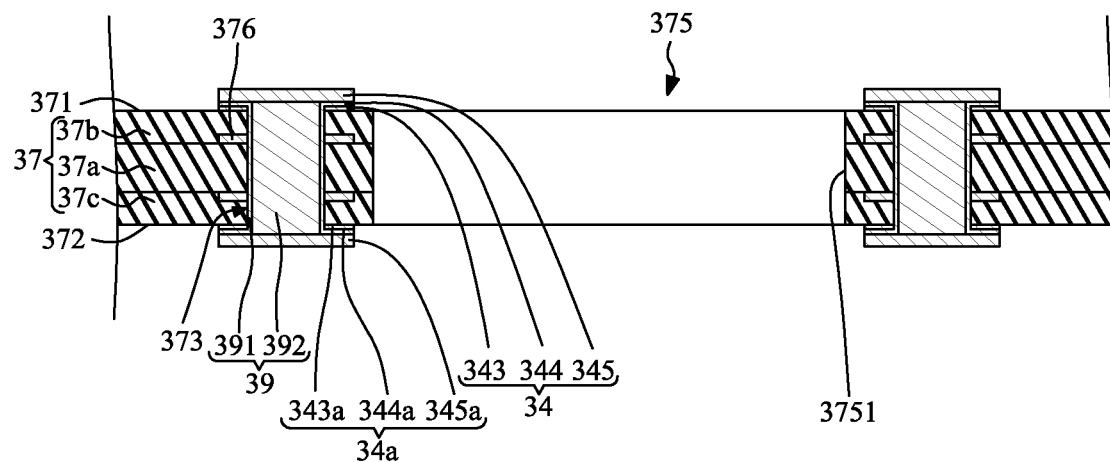
FIG. 23 illustrates one or more stages of an example of a method for manufacturing a wiring structure according to some embodiments of the present disclosure.

Referring to FIG. 23, a cavity 375 is formed to extend through the core portion 37 by a drilling technique (such as laser drilling or mechanical drilling) or other suitable techniques.

Figure 24:
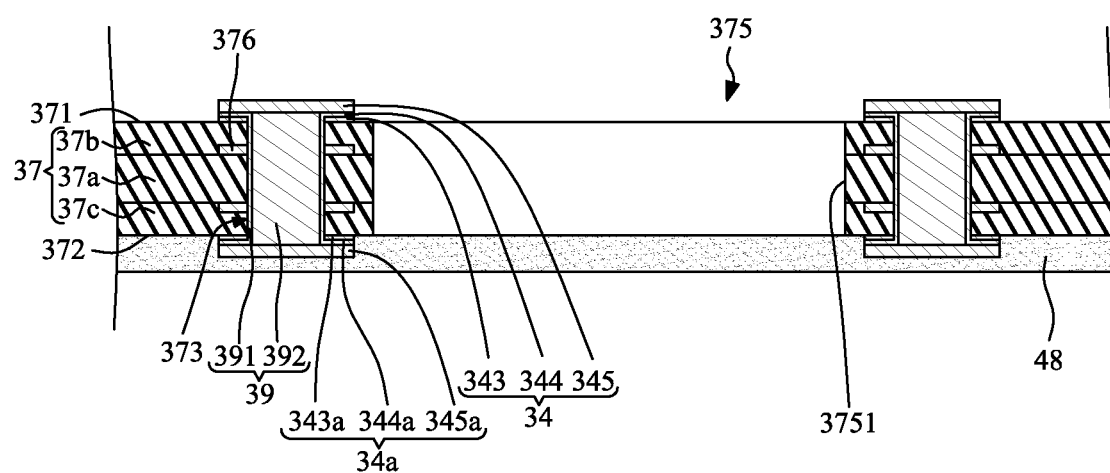
FIG. 24 illustrates one or more stages of an example of a method for manufacturing a wiring structure according to some embodiments of the present disclosure.

Referring to FIG. 24, the core portion 37 is disposed on a tape 48 (e.g., a die attach film, DAF). Meanwhile, the first lower circuit layer 34a may be embedded in the tape 48, and a sidewall 3751 of the cavity 375 and the tape 48 define an accommodating space.

Figure 25:
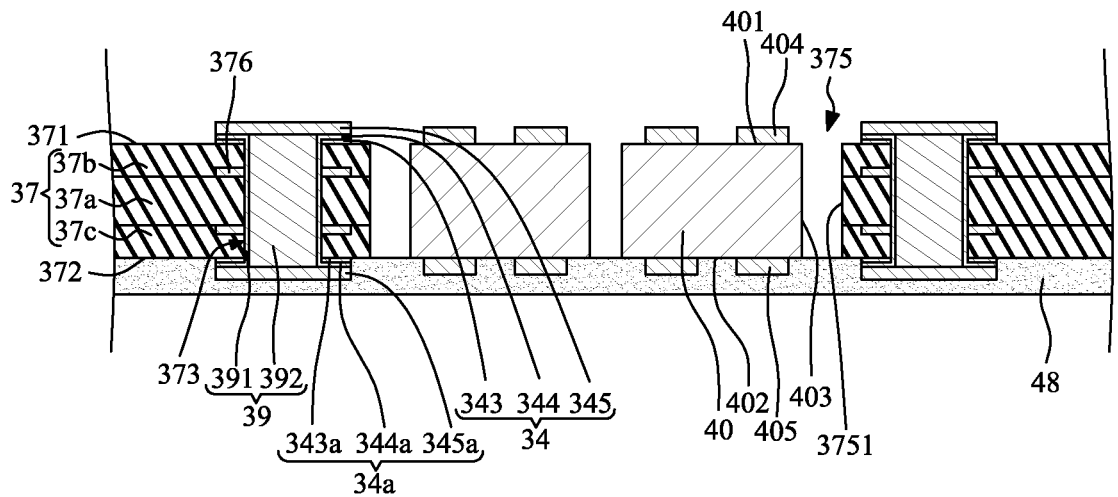
FIG. 25 illustrates one or more stages of an example of a method for manufacturing a wiring structure according to some embodiments of the present disclosure.

Referring to FIG. 25, a plurality of electronic devices 40 are disposed in the accommodating space defined by the cavity 375 and the tape 48. That is, the electronic devices 40 are disposed in the cavity 375 of the core portion 37 and on the tape 48. In some embodiments, the electronic devices 40 may be passive components, such as capacitors. The sizes and functions of the electronic devices 40 may be same as or different from each other. Each of the electronic devices 40 has a top surface 401, a bottom surface 402 opposite to the top surface 401 and a lateral surface 403 extending between the top surface 401 and the bottom surface 402. Each of the electronic devices 40 includes at least one electrical contact (e.g., a plurality of top electrical contacts 404 disposed adjacent to the top surface 401, and a plurality of bottom electrical contacts 405 disposed adjacent to the bottom surface 402). For example, each of the top electrical contacts 404 and the bottom electrical contacts 405 may be an electrode. In some embodiments, the electronic devices 40 may be disposed side by side, and the number of the electronic devices 40 may be greater than ten, greater than twenty, greater than forty, or greater than sixty. In some embodiments, the electronic devices 40 are known good electronic devices 40 that are reconstituted or rearranged in the cavity 375 of the core portion 37. As shown in FIG. 25, the bottom surfaces 402 of the electronic devices 40 may be substantially coplanar with the bottom surface 372 of the core portion 37, and the top surfaces 401 of the electronic devices 40 may be substantially coplanar with the top surface 371 of the core portion 37. Meanwhile, the bottom electrical contacts 405 may be embedded in the tape 48.

Figure 26:
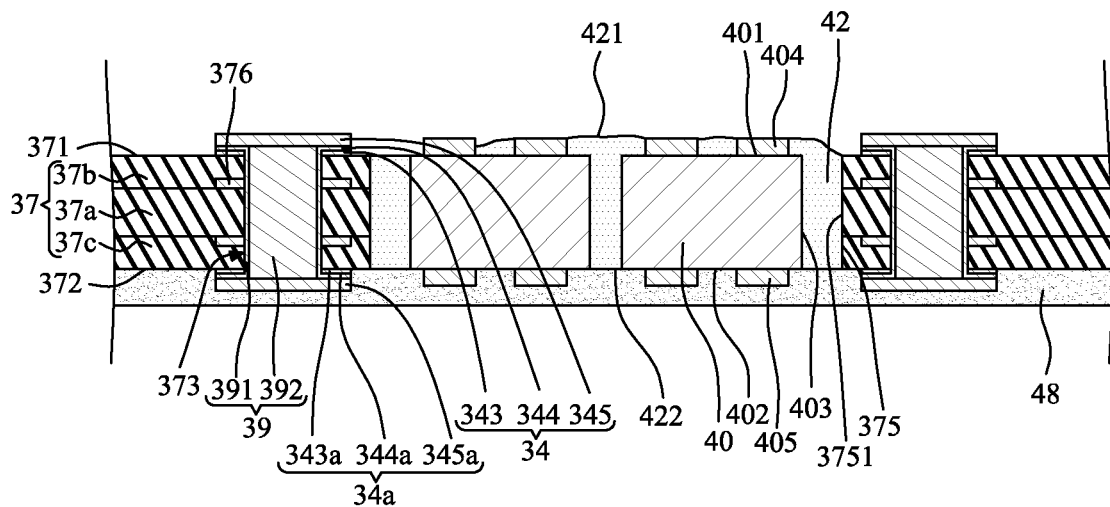
FIG. 26 illustrates one or more stages of an example of a method for manufacturing a wiring structure according to some embodiments of the present disclosure.

Referring to FIG. 26, a filling material 42 is formed or disposed between the electronic devices 40 and a sidewall 3751 of the cavity 375 of the core portion 37. As shown in FIG. 26, the filling material 42 is formed or disposed between the lateral surfaces 403 of adjacent two electronic devices 40, and between the lateral surface 403 the electronic device 40 and the sidewall 3751 of the cavity 375 of the core portion 37. The filling material 42 has a top surface 421 and a bottom surface 422 opposite to the top surface 421. A portion of the filling material 42 may extend to the top surfaces 401 of the electronic devices 40. That is, the top surface 421 of the filling material 42 may be higher than the top surfaces 401 of the electronic devices 40. However, the filling material 42 does not completely cover the electrical contact (e.g., the top electrical contacts 404 and the bottom electrical contacts 405). Thus, the electrical contact (e.g., the top electrical contacts 404 and the bottom electrical contacts 405) may be exposed from the filling material 42. As shown in FIG. 26, the bottom surface 422 of the filling material 42 may be substantially coplanar with the bottom surfaces 402 of the electronic devices 40.

Figure 27:
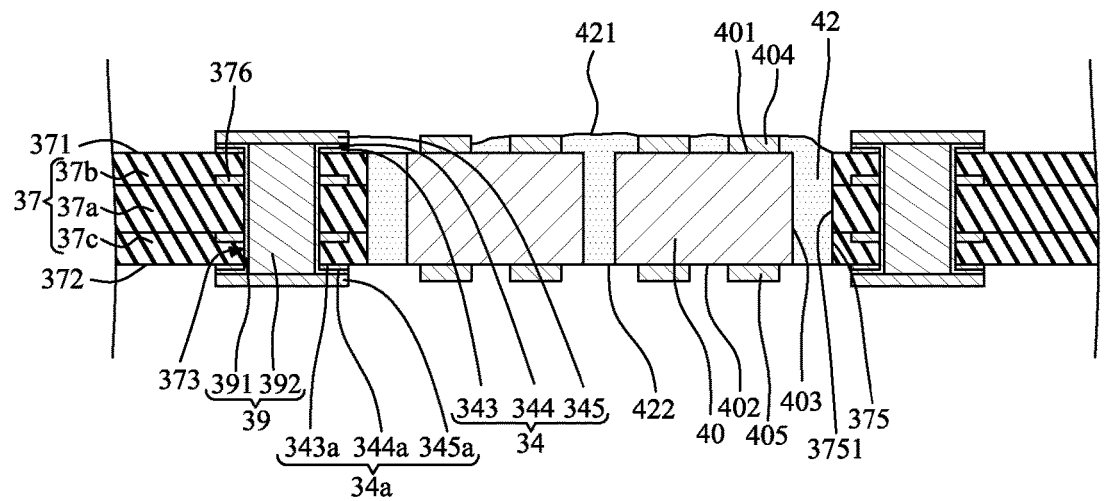
FIG. 27 illustrates one or more stages of an example of a method for manufacturing a wiring structure according to some embodiments of the present disclosure.

Referring to FIG. 27, the tape 48 is removed.

Figure 28:
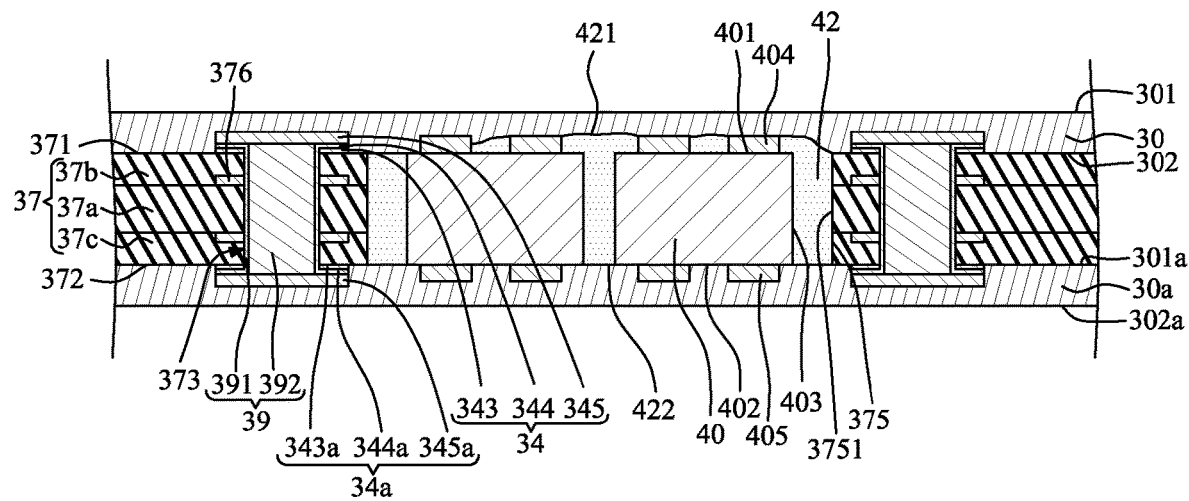
FIG. 28 illustrates one or more stages of an example of a method for manufacturing a wiring structure according to some embodiments of the present disclosure.

Referring to FIG. 28, a first upper dielectric layer 30 is formed or disposed on the top surface 371 of the core portion 37 to cover the top surface 371 of the core portion 37, the first upper circuit layer 34, the top surface 421 of the filling material 42 and the top electrical contacts 404 of the electronic devices 40 by a lamination technique or other suitable techniques. Meanwhile, a first lower dielectric layer 30a is formed or disposed on the bottom surface 372 of the core portion 37 to cover the bottom surface 372 of the core portion 37, the first lower circuit layer 34a, the bottom surface 422 of the filling material 42 and the bottom electrical contacts 405 of the electronic devices 40 by a lamination technique or other suitable techniques.

Figure 29:
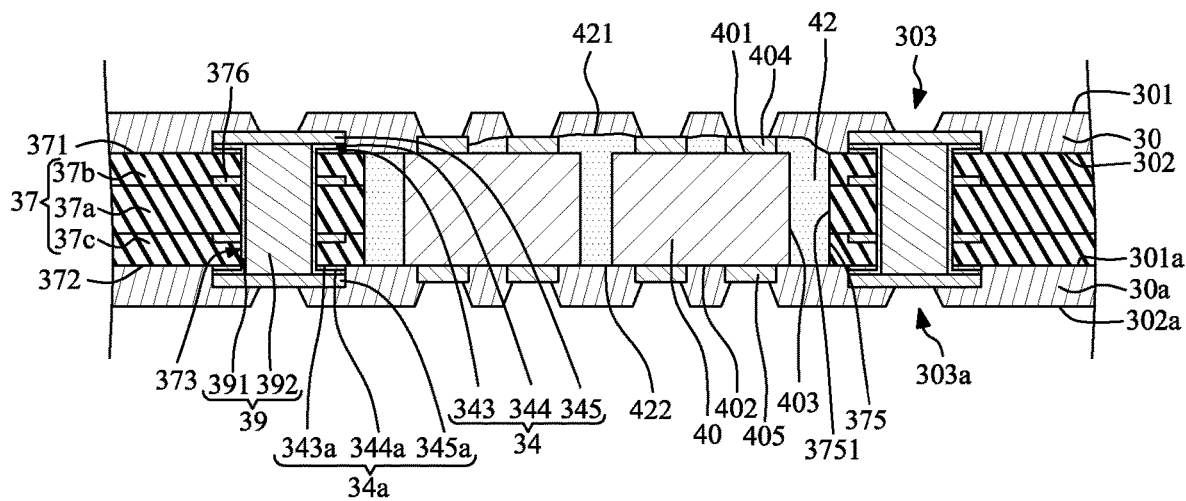
FIG. 29 illustrates one or more stages of an example of a method for manufacturing wiring structure according to some embodiments of the present disclosure.

Referring to FIG. 29, at least one through hole 303 is formed to extend through the first upper dielectric layer 30 to expose a portion of the first upper circuit layer 34 and the top electrical contacts 404 of the electronic devices 40 by a drilling technique or other suitable techniques. Meanwhile, at least one through hole 303a is formed to extend through the first lower dielectric layer 30a to expose a portion of the first lower circuit layer 34a and the bottom electrical contacts 405 of the electronic devices 40 by a drilling technique or other suitable techniques.

Figure 30:
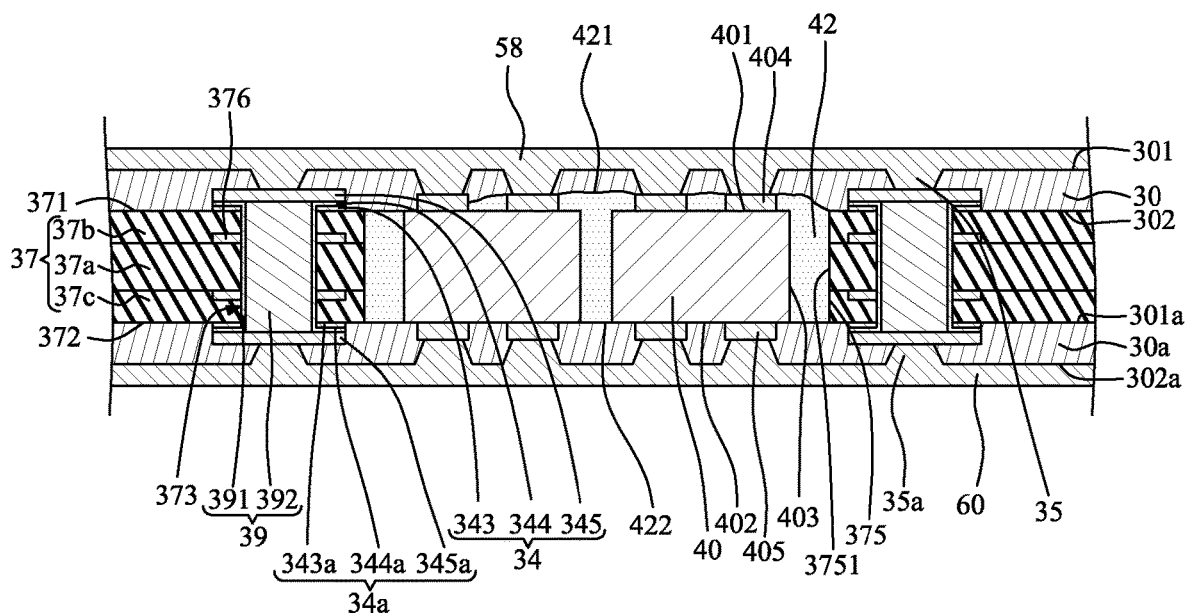
FIG. 30 illustrates one or more stages of an example of a method for manufacturing a wiring structure according to some embodiments of the present disclosure.

Referring to FIG. 30, a top metallic layer 58 is formed on the first upper dielectric layer 30 and in the through hole 303 to form an upper interconnection via 35 by a plating technique or other suitable techniques. Meanwhile, a bottom metallic layer 60 is formed on the first lower dielectric layer 30a and in the through hole 303a to form a lower interconnection via 35a by a plating technique or other suitable techniques. As shown in FIG. 30, the upper interconnection via 35 tapers downwardly, and the lower interconnection via 35a tapers upwardly.

Figure 31:
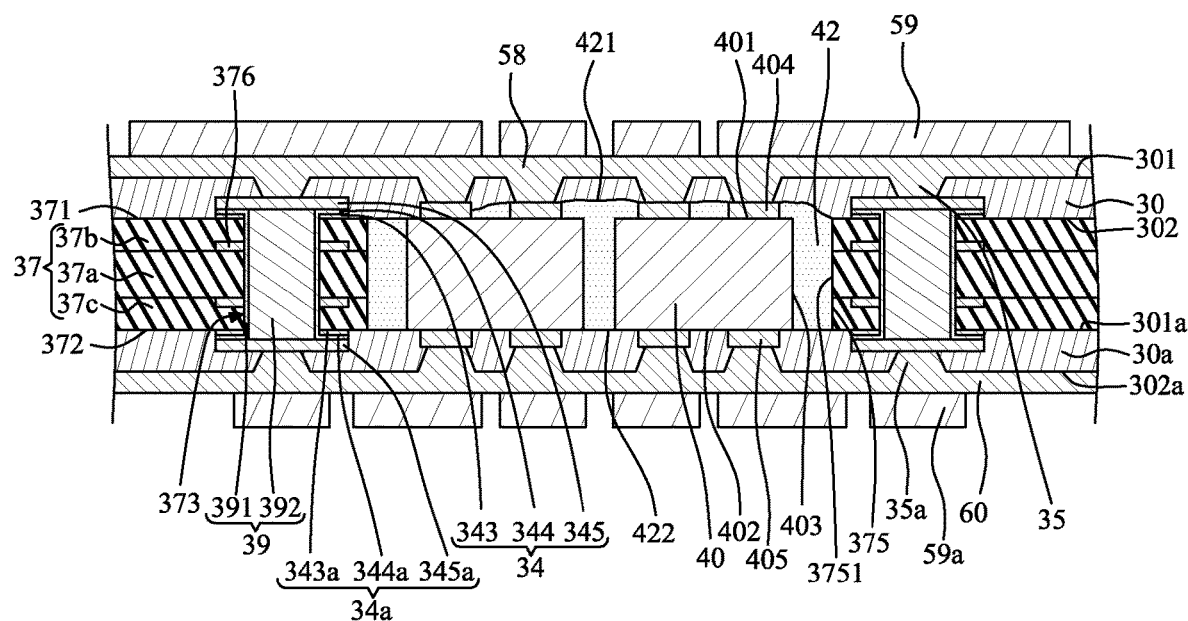
FIG. 31 illustrates one or more stages of an example of a method for manufacturing a wiring structure according to some embodiments of the present disclosure.

Referring to FIG. 31, a top photoresist layer 59 is formed or disposed on the top metallic layer 58, and a bottom photoresist layer 59a is formed or disposed on the bottom metallic layer 60. Then, the photoresist layers 59, 59a are patterned by exposure and development.

Figure 32:
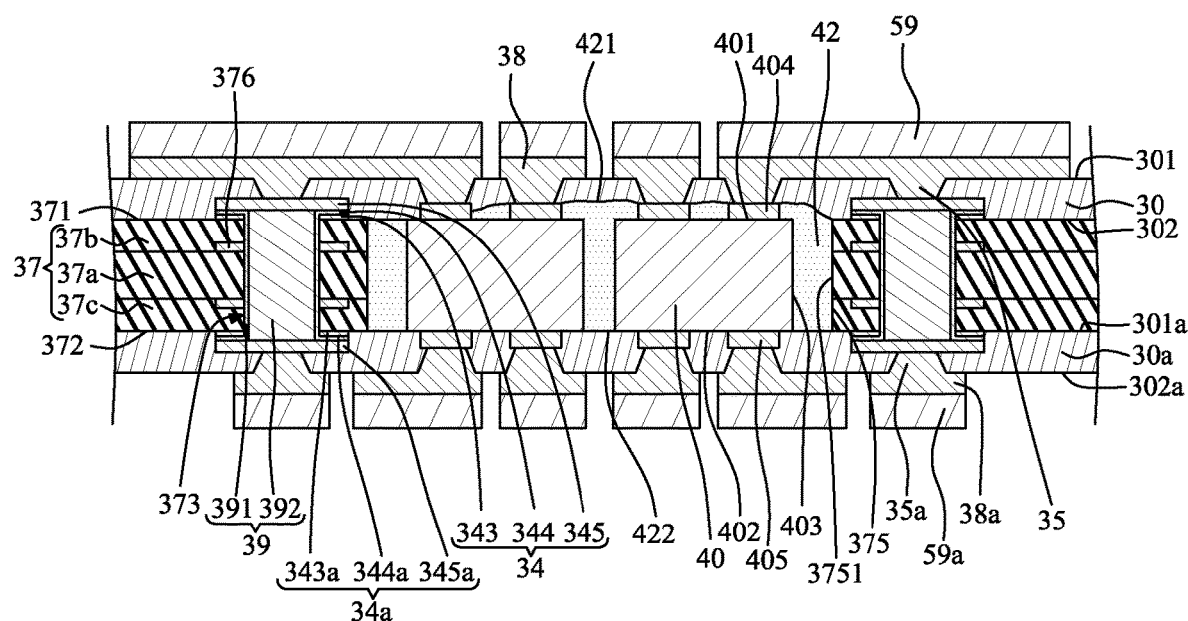
FIG. 32 illustrates one or more stages of an example of a method for manufacturing a wiring structure according to some embodiments of the present disclosure.

Referring to FIG. 32, portions of the top metallic layer 58 that are not covered by the top photoresist layer 59 are removed by an etching technique or other suitable techniques. Portions of the top metallic layer 58 that are covered by the top photoresist layer 59 remain to form a second upper circuit layer 38. Meanwhile, portions of the bottom metallic layer 60 that are not covered by the bottom photoresist layer 59a are removed by an etching technique or other suitable techniques. Portions of the bottom metallic layer 60 that are covered by the bottom photoresist layer 59a remain to form a second lower circuit layer 38a.

Figure 33:
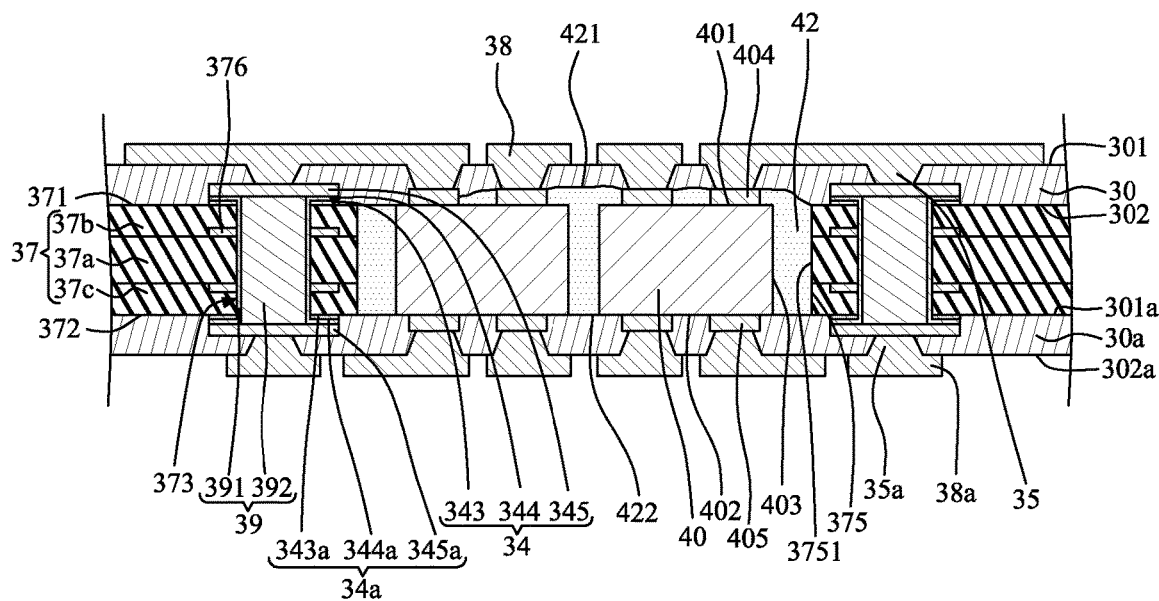
FIG. 33 illustrates one or more stages of an example of a method for manufacturing a wiring structure according to some embodiments of the present disclosure.

Referring to FIG. 33, the top photoresist layer 59 and the bottom photoresist layer 59a are removed by a stripping technique or other suitable techniques.

Figure 34:
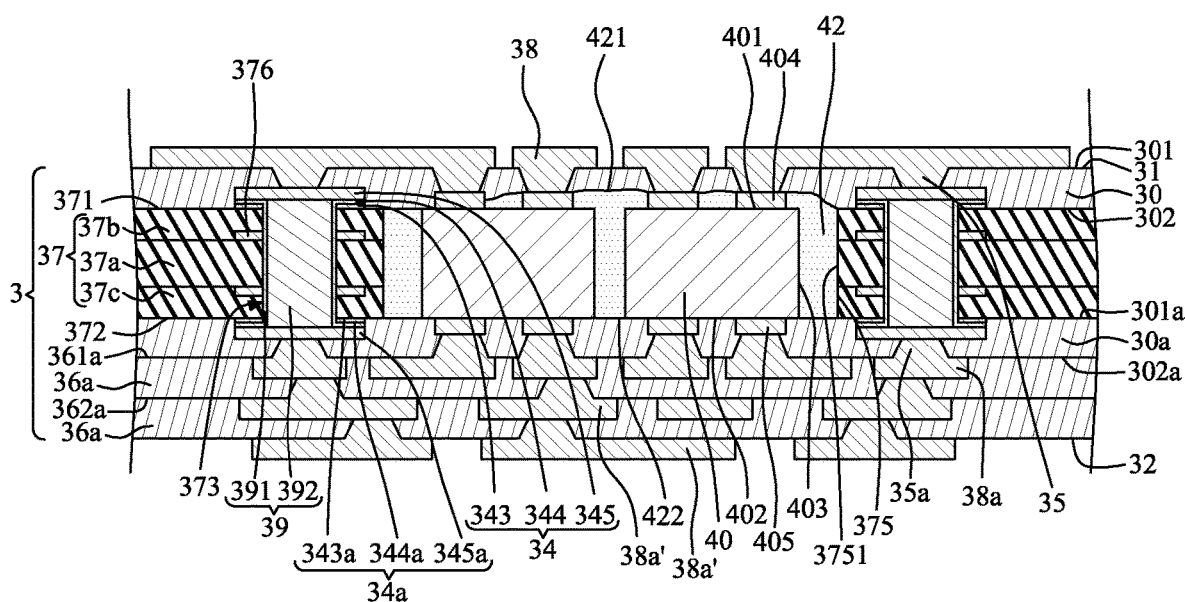
FIG. 34 illustrates one or more stages of an example of a method for manufacturing a wiring structure according to some embodiments of the present disclosure.

Referring to FIG. 34, a second lower dielectric layer 36a is formed or disposed on the bottom surface 302a of the first lower dielectric layer 30a to cover the bottom surface 302a of the first lower dielectric layer 30a and the second lower circuit layer 38a by a lamination technique or other suitable techniques. Then, a second lower circuit layer 38a' is formed on the second lower dielectric layer 36a. Then, a bottom second lower dielectric layer 36a is formed on the second lower dielectric layer 36a, and a bottom second lower circuit layer 38a' is formed on the bottom second lower dielectric layer 36a. Meanwhile, the lower conductive structure 3 is formed. Then, an electrical property (such as open circuit/short circuit) of the lower conductive structure 3 is tested.

Figure 35:
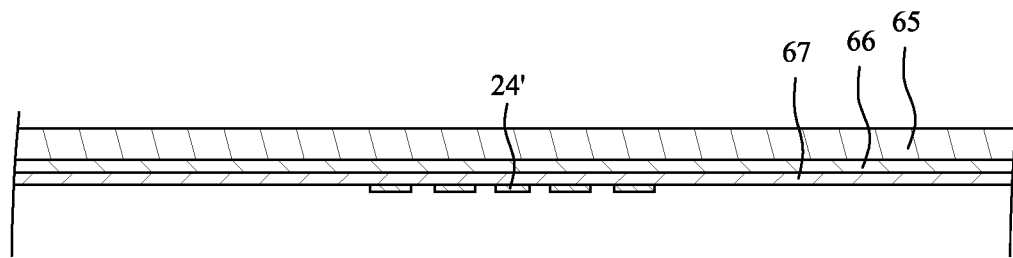
FIG. 35 illustrates one or more stages of an example of a method for manufacturing a wiring structure according to some embodiments of the present disclosure.

Referring to FIG. 35 through FIG. 43, an upper conductive structure 2 is provided. The upper conductive structure 2 is manufactured as follows. Referring to FIG. 35, a carrier 65 is provided. The carrier 65 may be a glass carrier, and may be in a wafer type, a panel type or a strip type. Then, a release layer 66 is coated on a bottom surface of the carrier 65. Then, a conductive layer 67 (e.g., a seed layer) is formed or disposed on the release layer 66 by a physical vapor deposition (PVD) technique or other suitable techniques. Then, a top circuit layer 24' is formed on the conductive layer 67.

Figure 36:
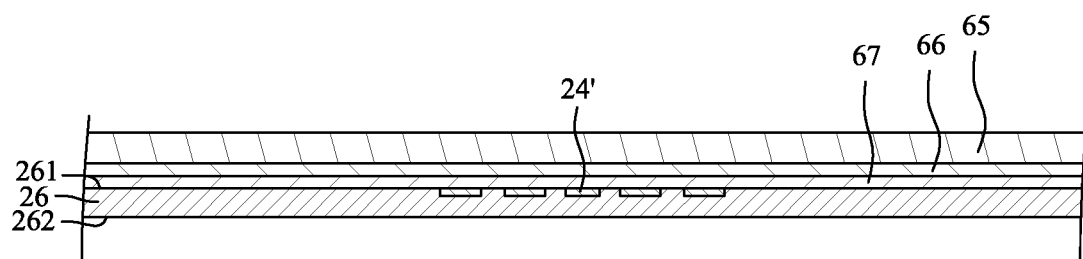
FIG. 36 illustrates one or more stages of an example of a method for manufacturing a wiring structure according to some embodiments of the present disclosure.

Referring to FIG. 36, a second dielectric layer 26 is formed on the conductive layer 67 to cover the top circuit layer 24' by a coating technique or other suitable techniques.

Figure 37:
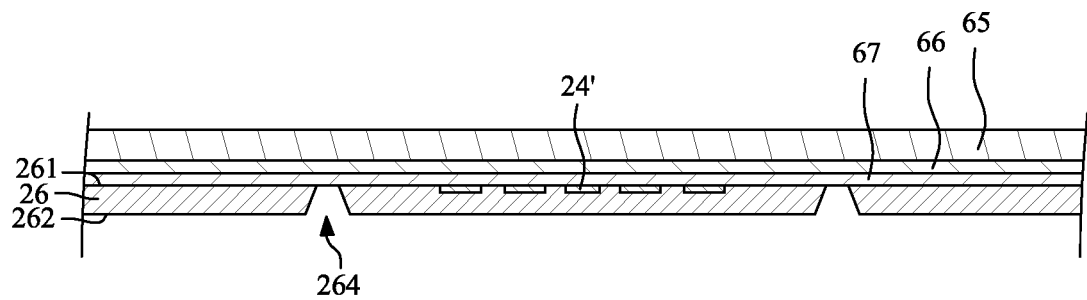
FIG. 37 illustrates one or more stages of an example of a method for manufacturing a wiring structure according to some embodiments of the present disclosure.

Referring to FIG. 37, at least one through hole 264 is formed to extend through the second dielectric layer 26 to expose a portion of the conductive layer 67 by an exposure and development technique or other suitable techniques.

Figure 38:
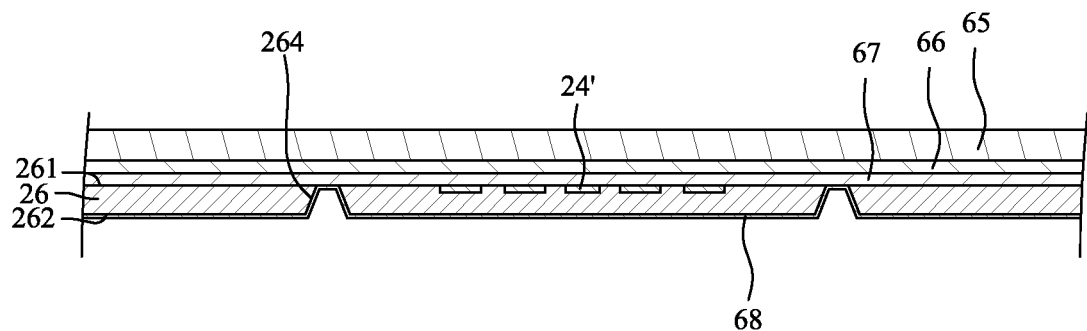
FIG. 38 illustrates one or more stages of an example of a method for manufacturing a wiring structure according to some embodiments of the present disclosure.

Referring to FIG. 38, a seed layer 68 is formed on a bottom surface 262 of the second dielectric layer 26 and in the through hole 264 by a PVD technique or other suitable techniques.

Figure 39:
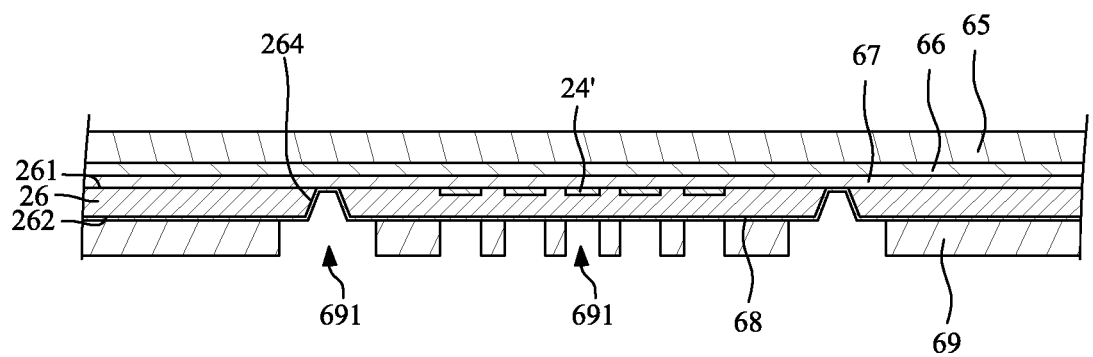
FIG. 39 illustrates one or more stages of an example of a method for manufacturing a wiring structure according to some embodiments of the present disclosure.

Referring to FIG. 39, a photoresist layer 69 is formed on the seed layer 68. Then, the photoresist layer 69 is patterned to expose portions of the seed layer 68 by an exposure and development technique or other suitable techniques. The photoresist layer 69 defines a plurality of openings 691. At least one opening 691 of the photoresist layer 69 corresponds to, and is aligned with, the through hole 264 of the second dielectric layer 26.

Figure 40:
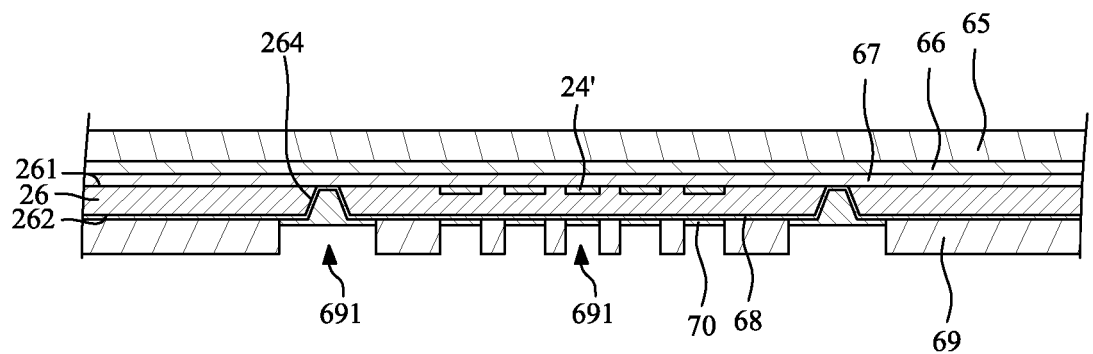
FIG. 40 illustrates one or more stages of an example of a method for manufacturing wiring structure according to some embodiments of the present disclosure.

Referring to FIG. 40, a conductive material 70 (e.g., a metallic material) is disposed in the openings 691 of the photoresist layer 69 and on the seed layer 68 by a plating technique or other suitable techniques.

Figure 41:
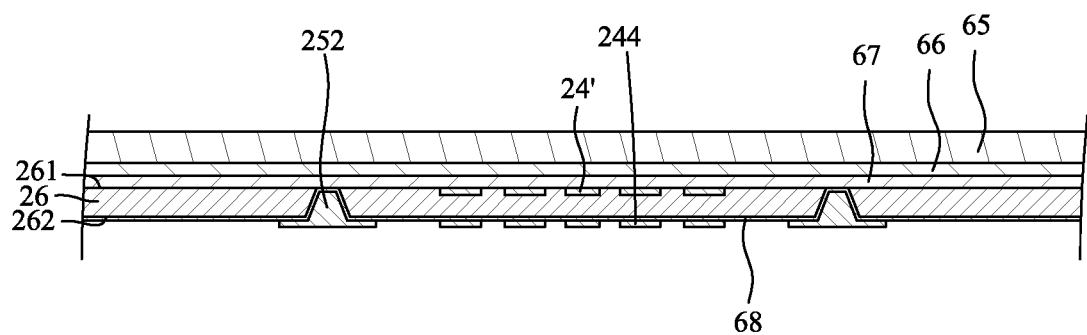
FIG. 41 illustrates one or more stages of an example of a method for manufacturing a wiring structure according to some embodiments of the present disclosure.

Referring to FIG. 41, the photoresist layer 69 is removed by a stripping technique or other suitable techniques.

Figure 42:
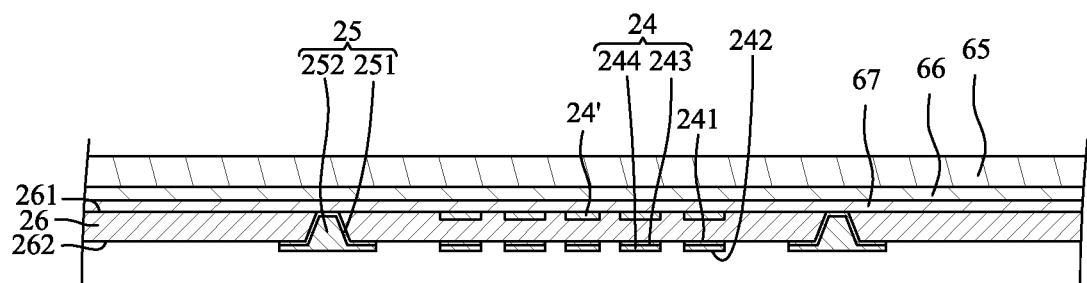
FIG. 42 illustrates one or more stages of an example of a method for manufacturing a wiring structure according to some embodiments of the present disclosure.

Referring to FIG. 42, portions of the seed layer 68 that are not covered by the conductive material 70 are removed by an etching technique or other suitable techniques. Meanwhile, a first circuit layer 24 and at least one inner via 25 are formed. The first circuit layer 24 may be a fan-out circuit layer or an RDL, and an L/S of the circuit layer 24 may be less than or equal to about 2 μm/about 2 μm, or less than or equal to about 1.8 μm/about 1.8 μm. The inner via 25 tapers upwardly.

Figure 43:
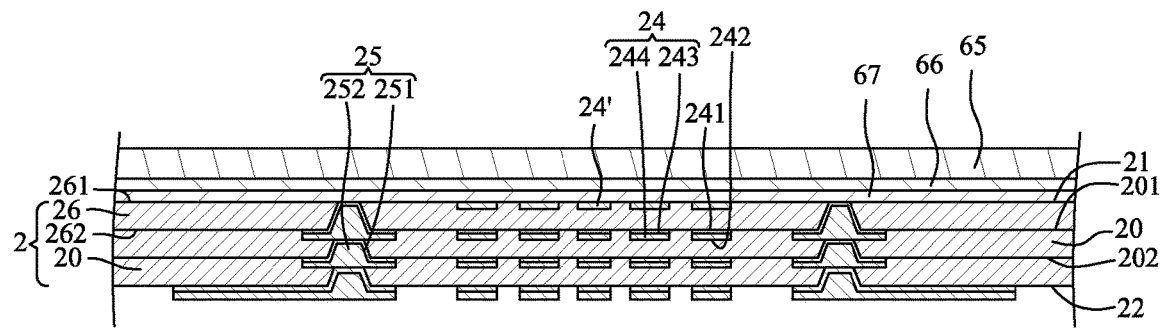
FIG. 43 illustrates one or more stages of an example of a method for manufacturing a wiring structure according to some embodiments of the present disclosure.

Referring to FIG. 43, a plurality of first dielectric layers 20 and a plurality of first circuit layers 24 are formed by repeating the stages of FIG. 36 to FIG. 42. In some embodiments, each first circuit layer 24 is embedded in the corresponding first dielectric layer 20, and a top surface 241 of the circuit layer 24 may be substantially coplanar with a top surface 201 of the first dielectric layer 20. Meanwhile, the upper conductive structure 2 is formed. Then, an electrical property (such as open circuit/short circuit) of the upper conductive structure 2 is tested.

Figure 44:
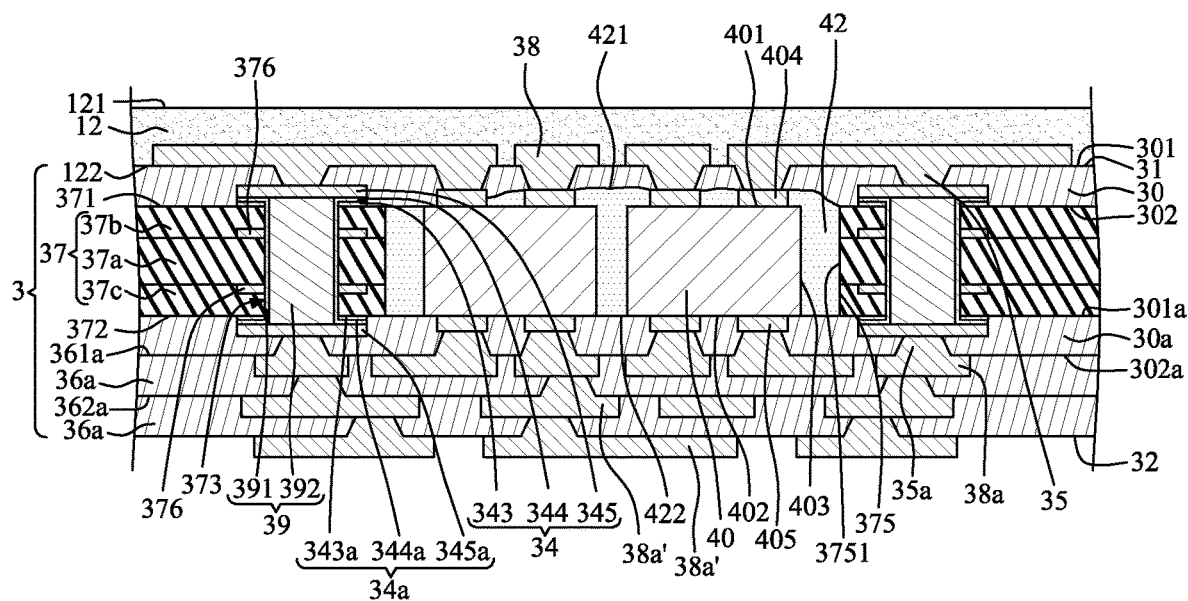
FIG. 44 illustrates one or more stages of an example of a method for manufacturing a wiring structure according to some embodiments of the present disclosure.

Referring to FIG. 44, an adhesive layer 12 is formed or applied on the top surface 31 of the lower conductive structure 3. In some embodiments, a material of the adhesive layer 12 may include Ajinomoto build-up film (ABF).

Figure 45:
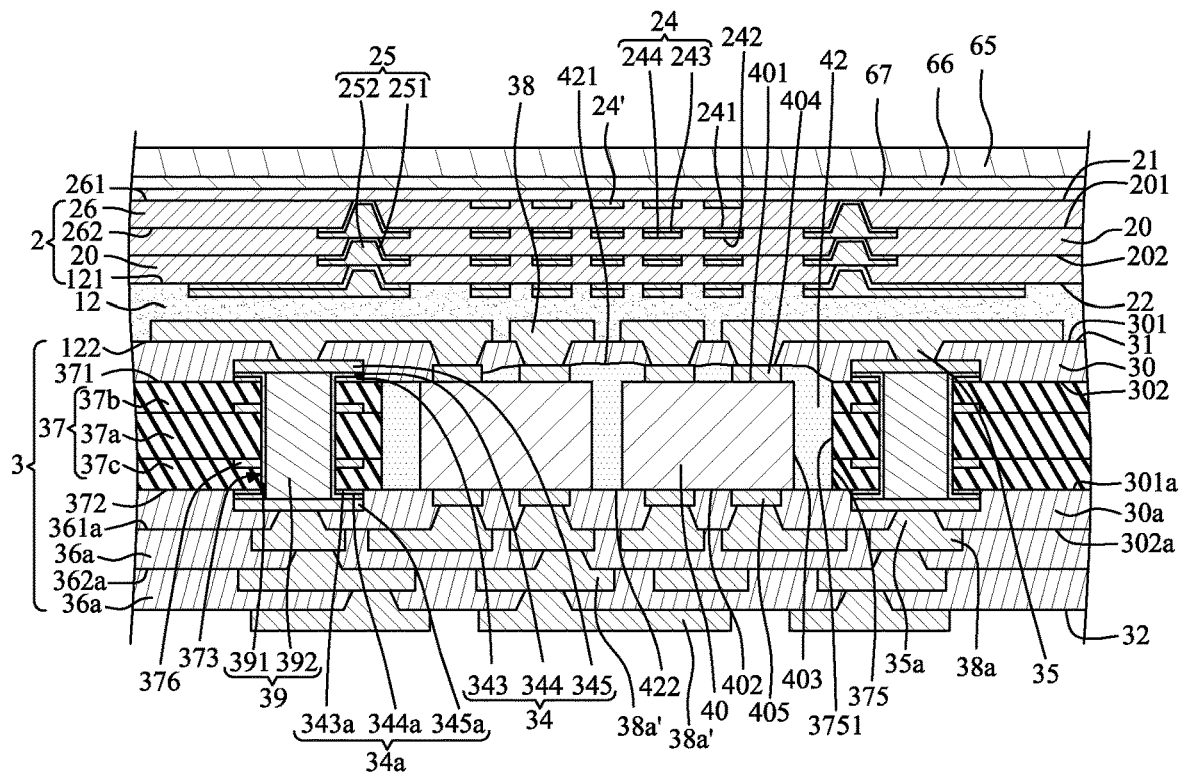
FIG. 45 illustrates one or more stages of an example of a method for manufacturing a wiring structure according to some embodiments of the present disclosure.

Referring to FIG. 45, the upper conductive structure 2 is attached to the lower conductive structure 3 through the adhesive layer 12. In some embodiments, the known good upper conductive structure 2 is attached to the known good lower conductive structure 3. Then, the adhesive layer 12 is cured to form an intermediate layer 12. The top surface 121 of the intermediate layer 12 contacts the bottom surface 22 of the upper conductive structure 2 (that is, the bottom surface 22 of the upper conductive structure 2 is attached to the top surface 121 of the intermediate layer 12), and the bottom surface 122 of the intermediate layer 12 contacts the top surface 31 of the lower conductive structure 3. Thus, the bottommost first circuit layer 24 of the upper conductive structure 2 and the second upper circuit layer 38 of the lower conductive structure 3 are embedded in the intermediate layer 12. In some embodiments, a bonding force between two adjacent dielectric layers (e.g., two adjacent first dielectric layers 20) of the upper conductive structure 2 is greater than a bonding force between a dielectric layer (e.g., the bottommost first dielectric layer 20) of the upper conductive structure 2 and the intermediate layer 12. A surface roughness of a boundary between two adjacent dielectric layers (e.g., two adjacent first dielectric layers 20) of the upper conductive structure 2 is greater than a surface roughness of a boundary between a dielectric layer (e.g., the bottommost first dielectric layer 20) of the upper conductive structure 2 and the intermediate layer 12.

Figure 46:
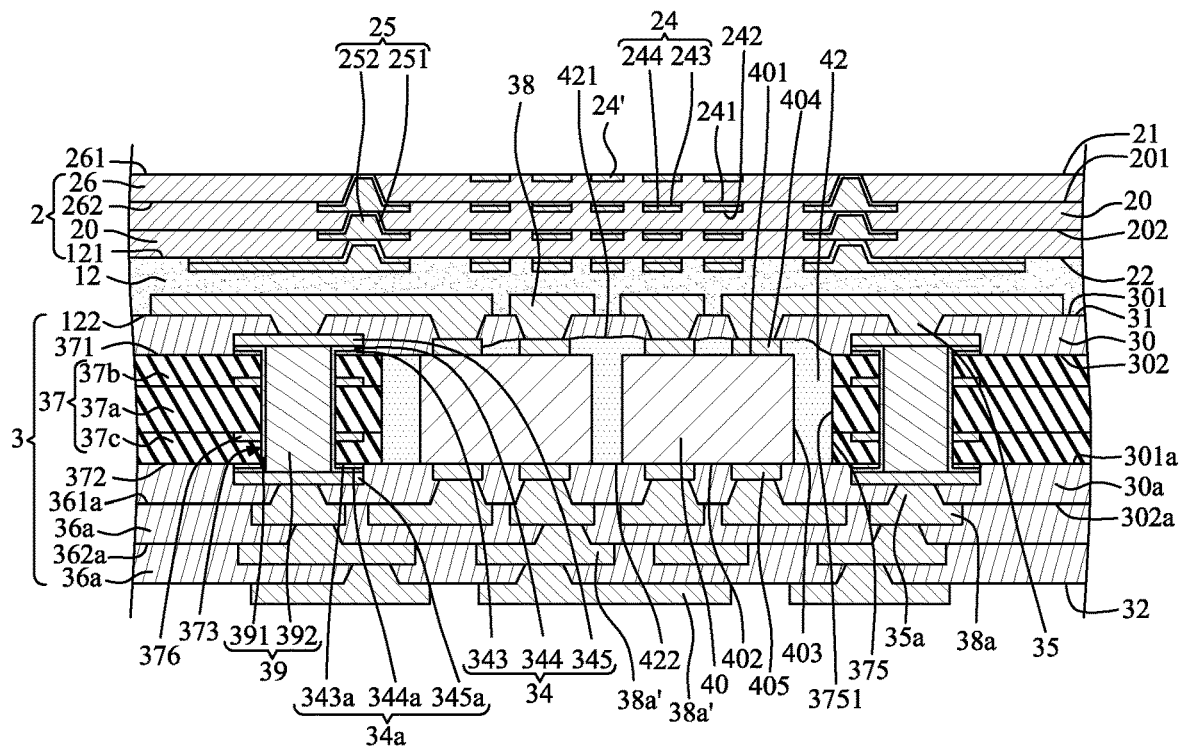
FIG. 46 illustrates one or more stages of an example of a method for manufacturing a wiring structure according to some embodiments of the present disclosure.

Referring to FIG. 46, the carrier 65, the release layer 66 and the conductive layer 67 are removed so as to expose a portion of the inner via 25 and the top circuit layer 24'.

Figure 47:
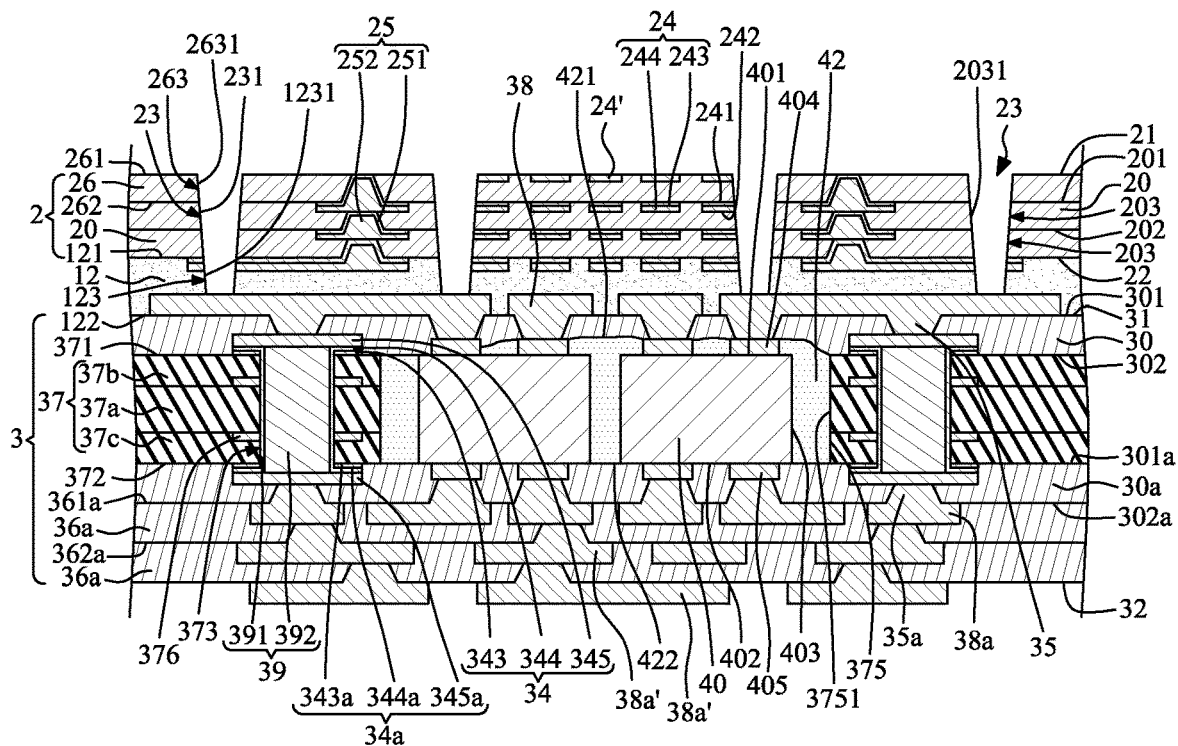
FIG. 47 illustrates one or more stages of an example of a method for manufacturing a wiring structure according to some embodiments of the present disclosure.

Referring to FIG. 47, at least one through hole 23 is formed to extend through at least a portion of the upper conductive structure 2 and the intermediate layer 12 by drilling (such as laser drilling) to exposes a circuit layer (e.g., second upper circuit layers 38) of the lower conductive structure 3. The through hole 23 may include a through hole 263 of the second dielectric layer 26, a plurality of through holes 203 of the first dielectric layers 20 and a through hole 123 of the intermediate layer 12. In some embodiments, the through hole 23 extends through the bottommost first circuit layer 24 of the upper conductive structure 2 and terminates at or on a topmost circuit layer (e.g., the second upper circuit layer 38) of the lower conductive structure 3. That is, the through hole 23 does not extend through the topmost circuit layer (e.g., the second upper circuit layer 38) of the lower conductive structure 3. The through hole 23 may expose a portion of the topmost circuit layer (e.g., the top surface of the second upper circuit layer 38) of the lower conductive structure 3. As shown in FIG. 47, the through hole 23 tapers downwardly; that is, a size of a top portion of the through hole 23 is greater than a size of a bottom portion of the through hole 23. In addition, an inner surface 1231 of the through hole 123 of the intermediate layer 12 is coplanar with or aligned with inner surfaces 2031 of the through holes 203 of the first dielectric layers 20 and an inner surface 2631 of the through hole 263 of the second dielectric layer 26.

Figure 48:
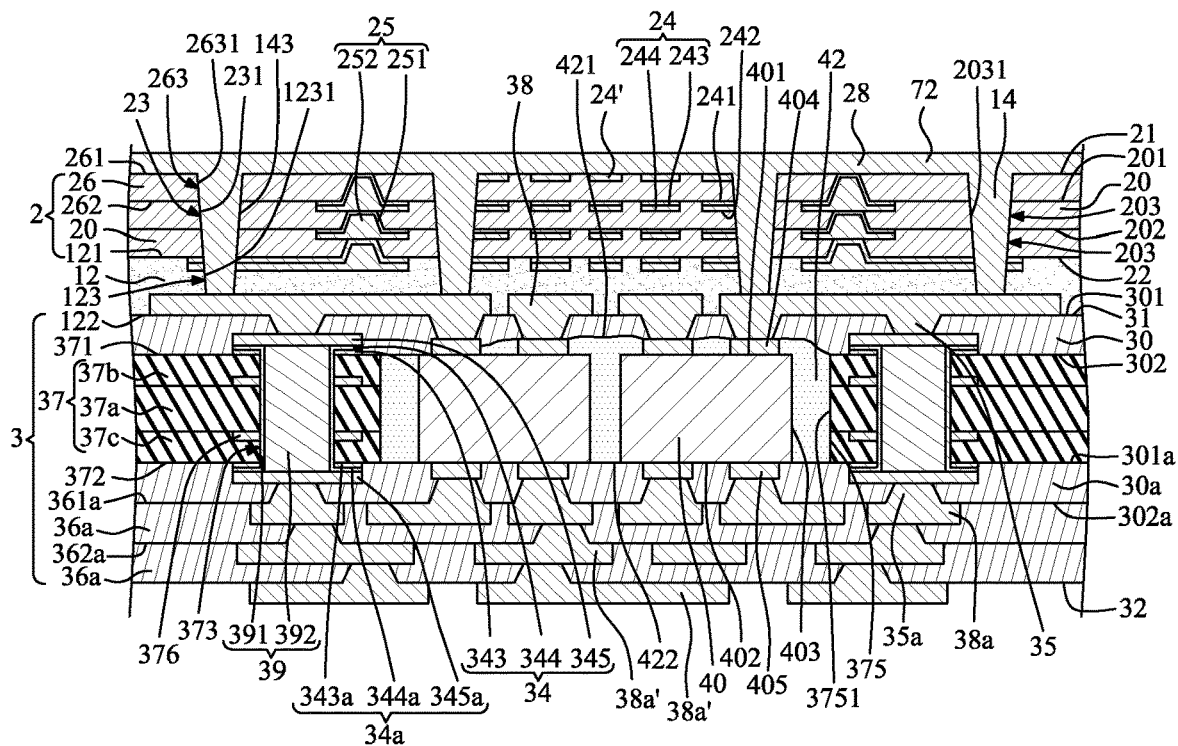
FIG. 48 illustrates one or more stages of an example of a method for manufacturing a wiring structure according to some embodiments of the present disclosure.

Referring to FIG. 48, a metallic layer 72 is formed on the to surface 21 of the upper conductive structure 2 and in the through hole 23 to form at least one upper through via 14 in the through hole 23 by plating technique or other suitable technique(s).

Figure 49:
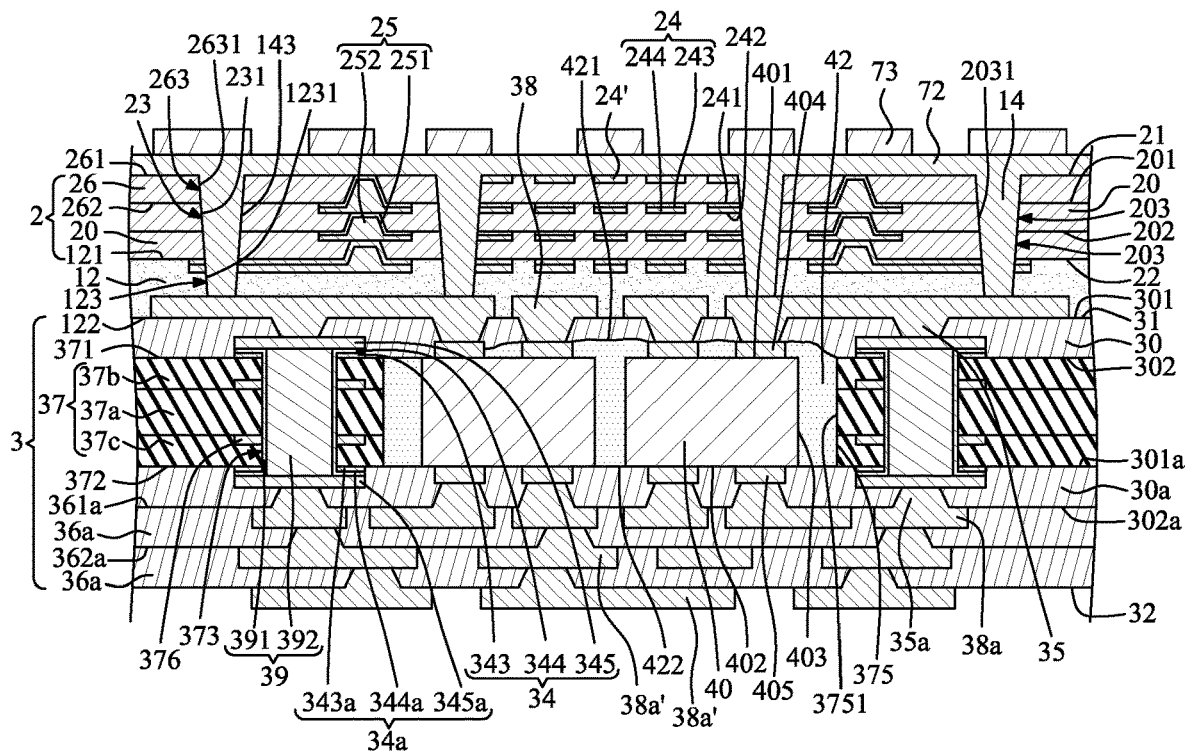
FIG. 49 illustrates one or more stages of an example of a method for manufacturing a wiring structure according to some embodiments of the present disclosure.

Referring to FIG. 49, a top photoresist layer 73 is formed or disposed on the metallic layer 72. Then, the top photoresist layer 73 is patterned by exposure and development technique or other suitable technique(s).

Figure 50:
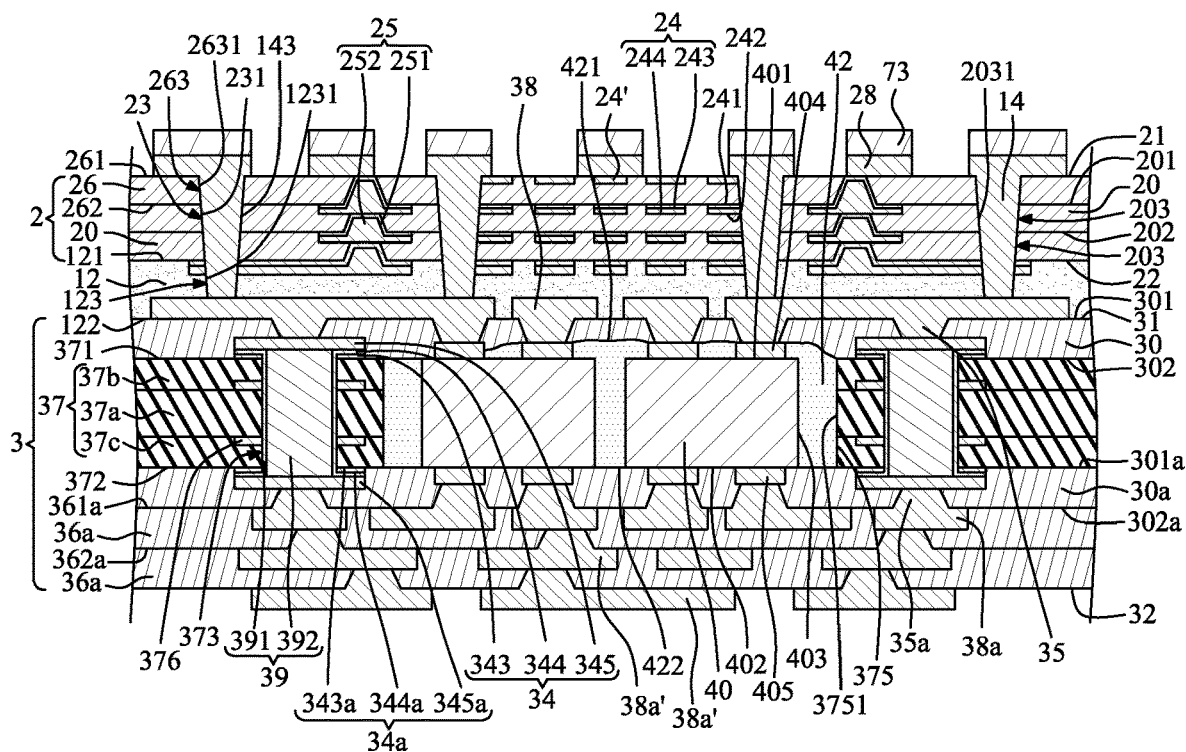
FIG. 50 illustrates one or more stages of an example of a method for manufacturing a wiring structure according to some embodiments of the present disclosure.

Referring to FIG. 50, the portions of the metallic layer 72 that are not covered by the top photoresist layer 73 is removed by etching technique or other suitable technique(s). The portions of the metallic layer 72 that are covered by the top photoresist layer 73 remain to form a second circuit layer 28. Then, the top photoresist layer 73 is removed by stripping technique or other suitable technique(s), so as to obtain the wiring structure 1 of FIG. 1.

Figure 51:
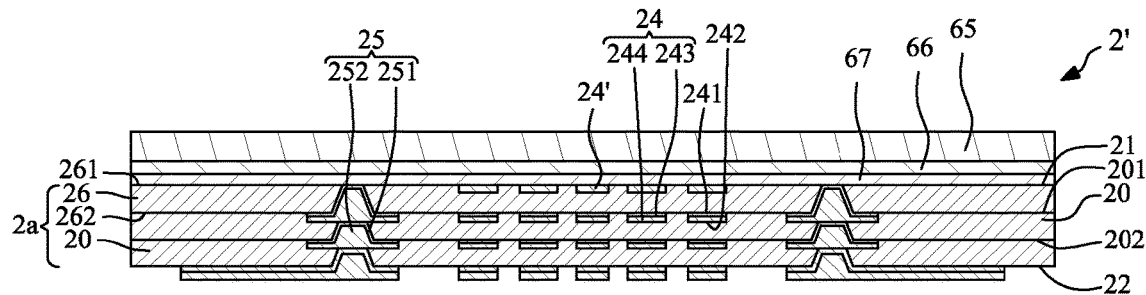
FIG. 51 illustrates one or more stages of an example of a method for manufacturing a wiring structure according to some embodiments of the present disclosure.

FIG. 51 through FIG. 54 illustrate a method for manufacturing a wiring structure according to some embodiments of the present disclosure. In some embodiments, the method is for manufacturing the wiring structure 1a shown in FIG. 3. The initial stages of the illustrated process are the same as, or similar to, the stages illustrated in FIG. 13 to FIG. 43. FIG. 51 depicts a stage subsequent to that depicted in FIG. 43.

Referring to FIG. 51, the upper conductive structure 2, the carrier 65, the release layer 66 and the conductive layer 67 are cut or singulated concurrently to form a plurality of strips 2'. Each of the strips 2' includes the upper conductive structure 2a that is a strip structure. Then, the strips 2' are tested. Alternatively, the upper conductive structure 2 may be tested before the cutting process.

Figure 52:
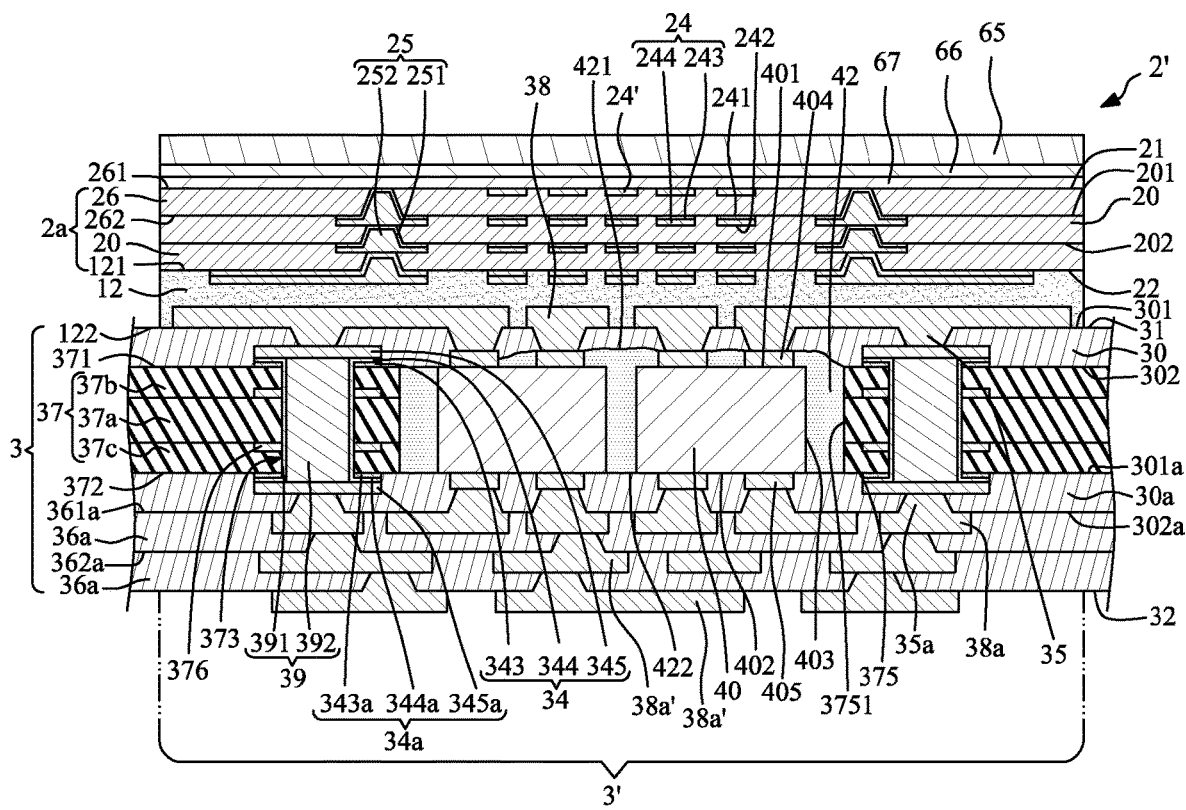
FIG. 52 illustrates one or more stages of an example of a method for manufacturing a wiring structure according to some embodiments of the present disclosure.

Referring to FIG. 52, the lower conductive structure 3 includes a plurality of strip areas 3'. Then, the strip areas 3' are tested. Then, an adhesin layer 12 is formed or applied on the top surface 31 of the lower conductive structure 3. Then, the strips 2' are attached to the strip areas 3' of the lower conductive structure 3 through the intermediate layer 12. The upper conductive structure 2a faces and is attached to the lower conductive structure 3. In some embodiments, only known good strip 2' is selectively attached to known good strip area 3' of the lower conductive structure 3.

Figure 53:
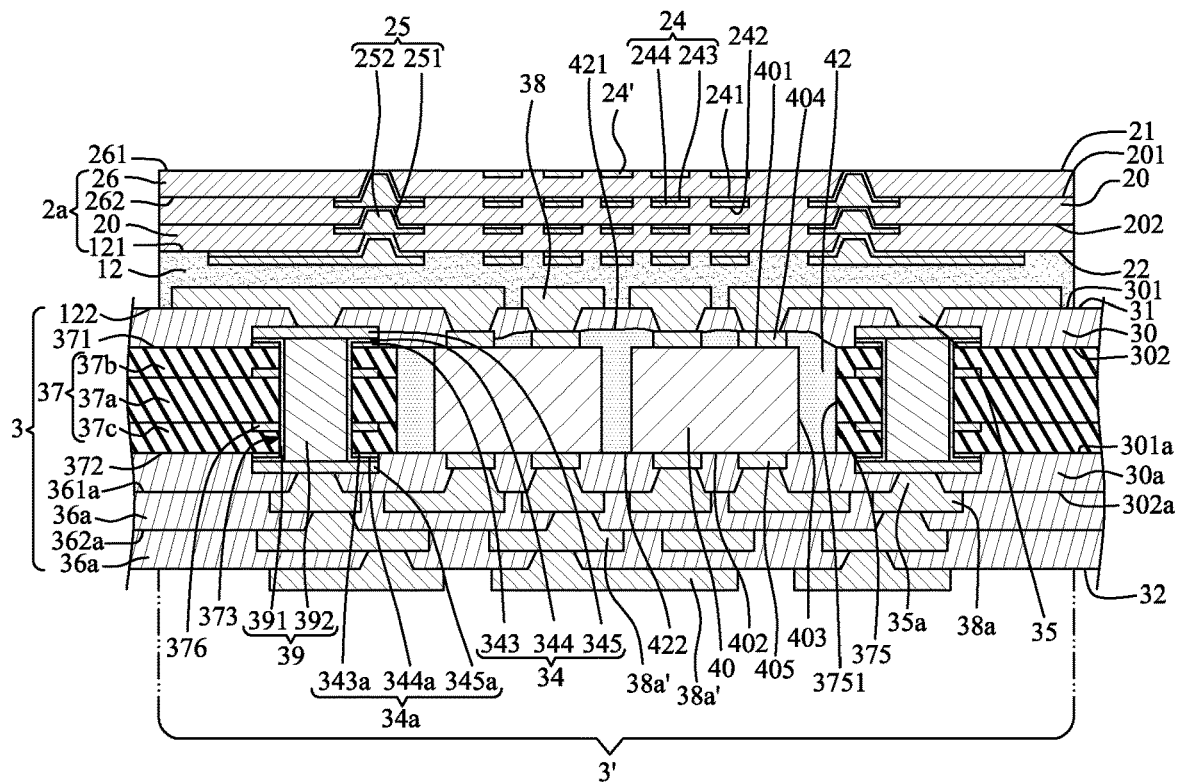
FIG. 53 illustrates one or more stages of an example of a method for manufacturing a wiring structure according to some embodiments of the present disclosure.

Referring to FIG. 53, the adhesive layer 12 is cured to form the intermediate layer 12. Then, the carrier 65, the release layer 66 and the conductive layer 67 are removed.

Figure 54:
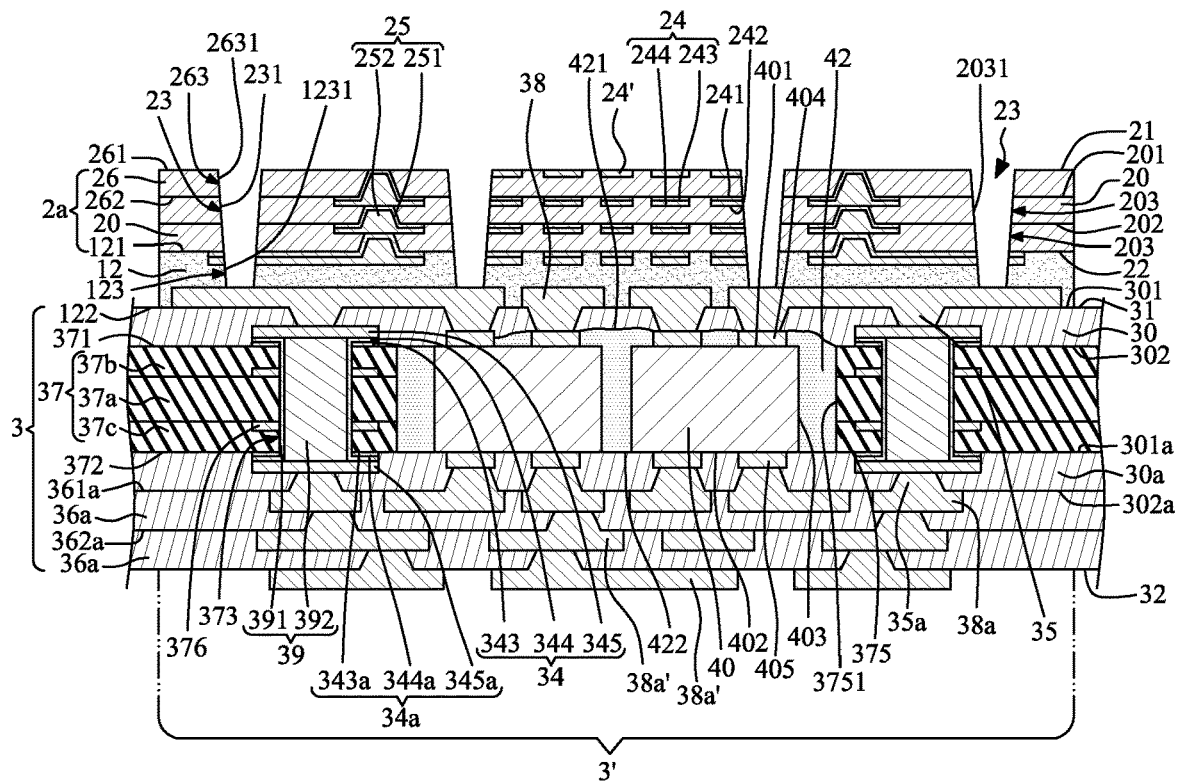
FIG. 54 illustrates one or more stages of an example of a method for manufacturing a wiring structure according to some embodiments of the present disclosure.

Referring to FIG. 54, at least one through hole 23 is formed to extend through at least a portion of the upper conductive structure 2 and the intermediate layer 12 by drilling (such as laser drilling) to exposes a circuit layer (e.g., second upper circuit layers 38) of the lower conductive structure 3. Then, the stages subsequent to that shown in FIG. 54 of the illustrated process are similar to the stages illustrated in FIG. 48 to FIG. 50. Then, the lower conductive structure 3 and the intermediate layer 12 are cut along the strip areas 3', so as to obtain the wiring structure 1a of FIG. 3.

Figure 55:
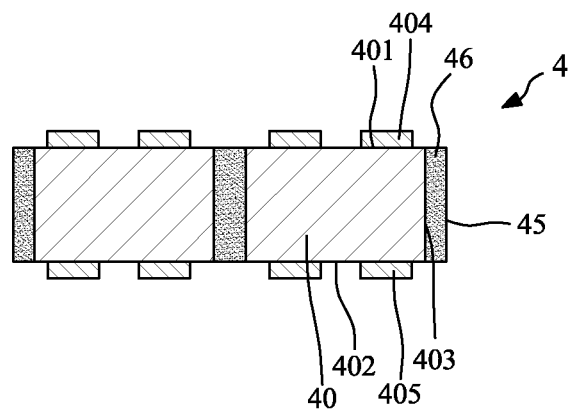
FIG. 55 illustrates one or more stages of an example of a method for manufacturing wiring structure according to some embodiments of the present disclosure.

FIG. 55 through FIG. 58 illustrate a method for manufacturing a wiring structure according to some embodiments of the present disclosure. In some embodiments, the method is for manufacturing the wiring structure 1g shown in FIG. 9. The initial stages of the illustrated process are the same as, or similar to, the stages illustrated in FIG. 13 to FIG. 24. FIG. 55 depicts a stage subsequent to that depicted in FIG. 24.

Referring to FIG. 55, a module 4 is provided. The module 4 includes a plurality of known good electronic devices 40 and an encapsulant 46 encapsulating the known good electronic devices 40. The encapsulant 46 does not completely cover the electrical contact (e.g., the top electrical contacts 404 and the bottom electrical contacts 405). Thus, the electrical contact (e.g., the top electrical contacts 404 and the bottom electrical contacts 405) may be exposed from the encapsulant 46. A top surface of the encapsulant 46 may be substantially coplanar with the bottom surfaces 402 of the electronic devices 40, and a bottom surface of the encapsulant 46 may be substantially coplanar with the bottom surfaces 402 of the electronic devices 40. The module 4 has a lateral surface 45. In some embodiments, the electronic devices 40 may be disposed side by side, and the number of the electronic devices 40 may be greater than ten, greater than twenty, greater than forty, or greater than sixty.

Figure 56:
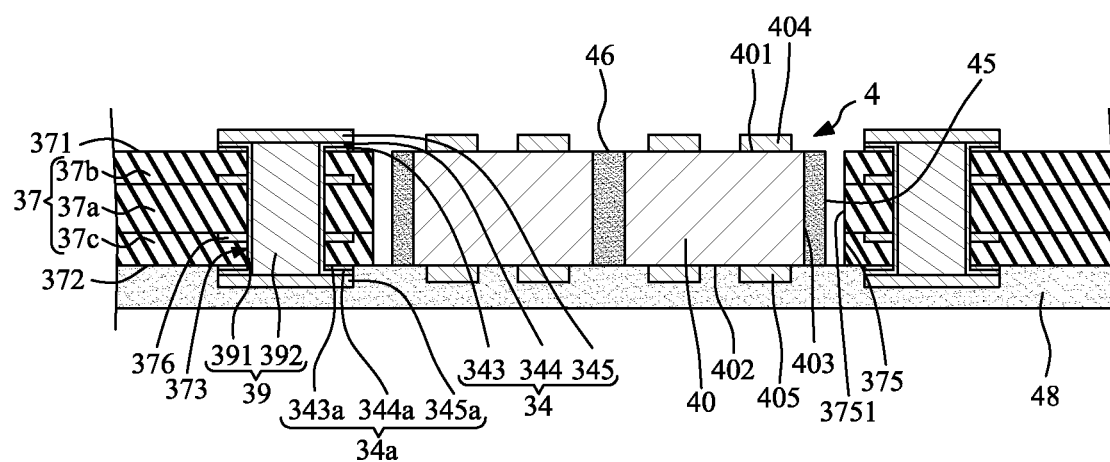
FIG. 56 illustrates one or more stages of an example of a method for manufacturing a wiring structure according to some embodiments of the present disclosure.

Referring to FIG. 56, the module 4 is disposed in the accommodating space defined by the cavity 375 and the tape 48. That is, the module 4 is disposed in the cavity 375 of the core portion 37 and on the tape 48. The bottom surface of the encapsulant 46 of the module 4 may be substantially coplanar with the bottom surface 372 of the core portion 37, and the top surface of the encapsulant 46 of the module 4 may be substantially coplanar with the top surface 371 of the core portion 37. Meanwhile, the bottom electrical contacts 405 may be embedded in the tape 48.

Figure 57:
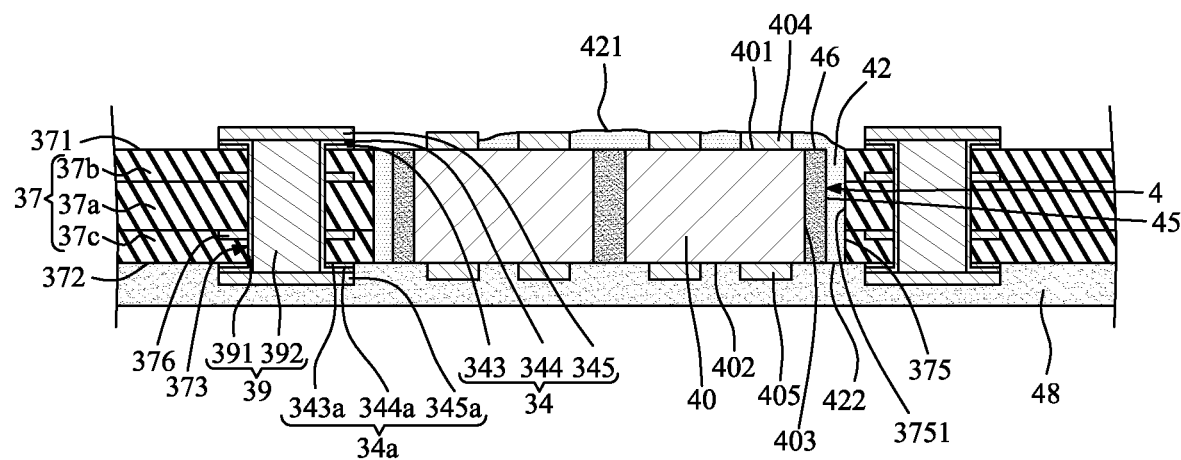
FIG. 57 illustrates one or more stages of an example of a method for manufacturing a wiring structure according to some embodiments of the present disclosure.

Referring to FIG. 57, a filling material 42 is formed or disposed between the lateral surface 45 of the module 4 and a sidewall 3751 of the cavity 375 of the core portion 37. In some embodiments, a portion of the filling material 42 may extend to the top surface of the encapsulant 46 of the module 4.

Figure 58:
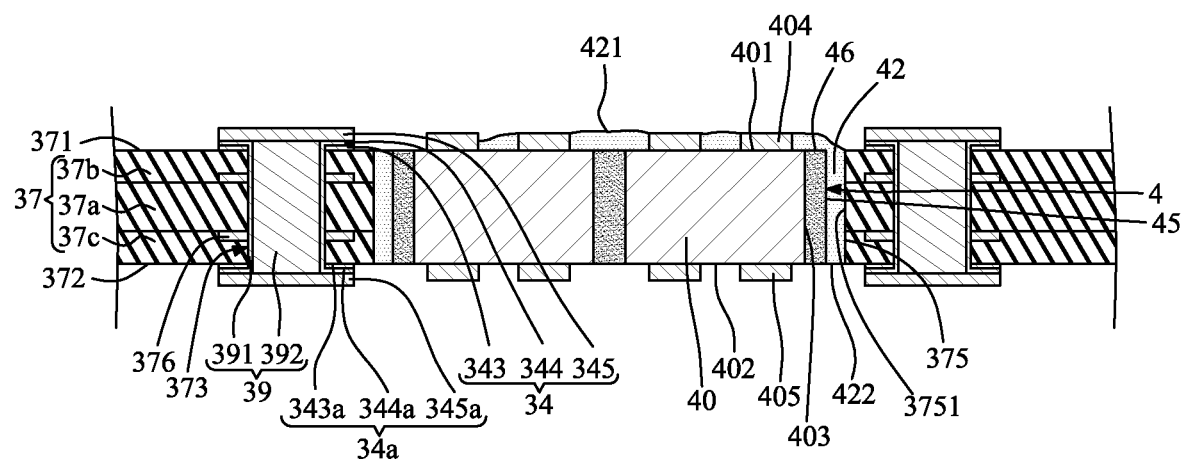
FIG. 58 illustrates one or more stages of an example of a method for manufacturing wiring structure according to some embodiments of the present disclosure.

Referring to FIG. 58, the tape 48 is removed. Then, the stages subsequent to that shown in FIG. 58 of the illustrated process are similar to the stages illustrated in FIG. 28 to FIG. 50, so as to obtain the wiring structure 1g of FIG. 9.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A wiring structure, comprising:
a low-density conductive structure including a core portion and a module, wherein the module is disposed in a cavity of the core portion, and the module includes at least one electronic device encapsulated in an encapsulant thereof; and
a high-density conductive structure disposed on the low-density conductive structure, wherein the low-density conductive structure further includes an upper circuit layer disposed on the core portion and covering the module and a top dielectric layer, wherein the top dielectric layer is in contact with the high-density conductive structure; and
a top circuit layer embedded in the top dielectric layer adjacent to a top surface of the top dielectric layer.

2. The wiring structure of claim 1, wherein the low-density conductive structure further includes an upper dielectric layer, the upper circuit layer is disposed on the upper dielectric layer, and upper dielectric layer is in contact with a filling material disposed between a lateral surface of the module and an inner sidewall of the cavity of the core portion.

3. The wiring structure of claim 1, wherein a top surface of the top dielectric layer is substantially coplanar with a top surface of the top circuit layer.

4. A wiring structure, comprising:
- a low-density conductive structure including a core portion and a module, wherein the module is disposed in a cavity of the core portion, and the module includes at least one electronic device encapsulated in an encapsulant thereof; and
- a high-density conductive structure disposed on the low-density conductive structure, wherein the low-density conductive structure further includes a plurality of interconnection vias disposed around the module, wherein one of the plurality of interconnection vias includes a base metallic layer disposed on a side wall of a through hole of the core portion.

* * * * *